(12) United States Patent
Billingsley et al.

(10) Patent No.: US 12,171,101 B2
(45) Date of Patent: Dec. 17, 2024

(54) MICROELECTRONIC DEVICES INCLUDING CONDUCTIVE STRUCTURES

(71) Applicant: Micron Technology, Inc., Boise, ID (US)

(72) Inventors: Daniel Billingsley, Meridian, ID (US); Matthew J. King, Boise, ID (US); Jordan D. Greenlee, Boise, ID (US); Yongjun J. Hu, Boise, ID (US); Tom George, Boise, ID (US); Amritesh Rai, Boise, ID (US); Sidhartha Gupta, Boise, ID (US); Kyle A. Ritter, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/822,708

(22) Filed: Aug. 26, 2022

(65) Prior Publication Data
US 2022/0415917 A1     Dec. 29, 2022

Related U.S. Application Data

(63) Continuation of application No. 16/943,826, filed on Jul. 30, 2020, now Pat. No. 11,527,546.

(51) Int. Cl.
*H10B 41/30*     (2023.01)
*H01L 21/28*     (2006.01)
(Continued)

(52) U.S. Cl.
CPC ........ *H10B 43/40* (2023.02); *H01L 29/40114* (2019.08); *H01L 29/40117* (2019.08);
(Continued)

(58) Field of Classification Search
None
See application file for complete search history.

(56) References Cited

U.S. PATENT DOCUMENTS

| 9,490,262 | B1 | 11/2016 | Pang et al. |
| 10,170,493 | B1 | 1/2019 | Greenlee et al. |
| (Continued) | | | |

FOREIGN PATENT DOCUMENTS

| CN | 107658306 A | 2/2018 |

OTHER PUBLICATIONS

International Search Report for Application No. PCT/US2021/040267, mailed Oct. 25, 2021, 2 pages.
(Continued)

*Primary Examiner* — Sarah K Salerno
(74) *Attorney, Agent, or Firm* — TraskBritt

(57) ABSTRACT

A microelectronic device comprises a stack structure comprising alternating conductive structures and insulative structures arranged in tiers, each of the tiers individually comprising a conductive structure and an insulative structure, strings of memory cells vertically extending through the stack structure, the strings of memory cells comprising a channel material vertically extending through the stack structure, and another stack structure vertically overlying the stack structure and comprising other tiers of alternating levels of other conductive structures and other insulative structures, the other conductive structures exhibiting a conductivity greater than a conductivity of the conductive structures of the stack structure. Related memory devices, electronic systems, and methods are also described.

20 Claims, 16 Drawing Sheets

(51) Int. Cl.
    *H01L 29/49*     (2006.01)
    *H10B 41/27*     (2023.01)
    *H10B 41/41*     (2023.01)
    *H10B 43/27*     (2023.01)
    *H10B 43/30*     (2023.01)
    *H10B 43/40*     (2023.01)

(52) U.S. Cl.
    CPC ........... *H01L 29/495* (2013.01); *H10B 41/27* (2023.02); *H10B 41/30* (2023.02); *H10B 41/41* (2023.02); *H10B 43/27* (2023.02); *H10B 43/30* (2023.02)

(56) References Cited

U.S. PATENT DOCUMENTS

| | | |
|---|---|---|
| 10,242,995 B2 | 3/2019 | Zhu et al. |
| 10,283,524 B1 | 5/2019 | Greenlee et al. |
| 10,290,650 B1 | 5/2019 | Iwai |
| 10,475,804 B1 | 11/2019 | Nishikawa et al. |
| 2014/0061776 A1 | 3/2014 | Kwon et al. |
| 2014/0264533 A1 | 9/2014 | Simsek-Ege et al. |
| 2015/0348989 A1 | 12/2015 | Pekny |
| 2016/0104715 A1 | 4/2016 | Pachamuthu et al. |
| 2016/0322381 A1 | 11/2016 | Liu et al. |
| 2017/0062337 A1 | 3/2017 | Park et al. |
| 2017/0236779 A1 | 8/2017 | Komori |
| 2019/0237476 A1* | 8/2019 | Lee ........................ H10B 43/27 |
| 2019/0244972 A1 | 8/2019 | Hopkins et al. |
| 2019/0333581 A1 | 10/2019 | Diep et al. |
| 2020/0020715 A1 | 1/2020 | Nakamura et al. |
| 2020/0212065 A1 | 7/2020 | Zhu et al. |
| 2020/0235112 A1 | 7/2020 | Howder et al. |
| 2021/0358806 A1* | 11/2021 | Hu ........................ H01L 21/321 |

OTHER PUBLICATIONS

Written Opinion of the International Searching Authority for Application No. PCT/US2021/040267, mailed Oct. 25, 2021, 3 pages.

* cited by examiner

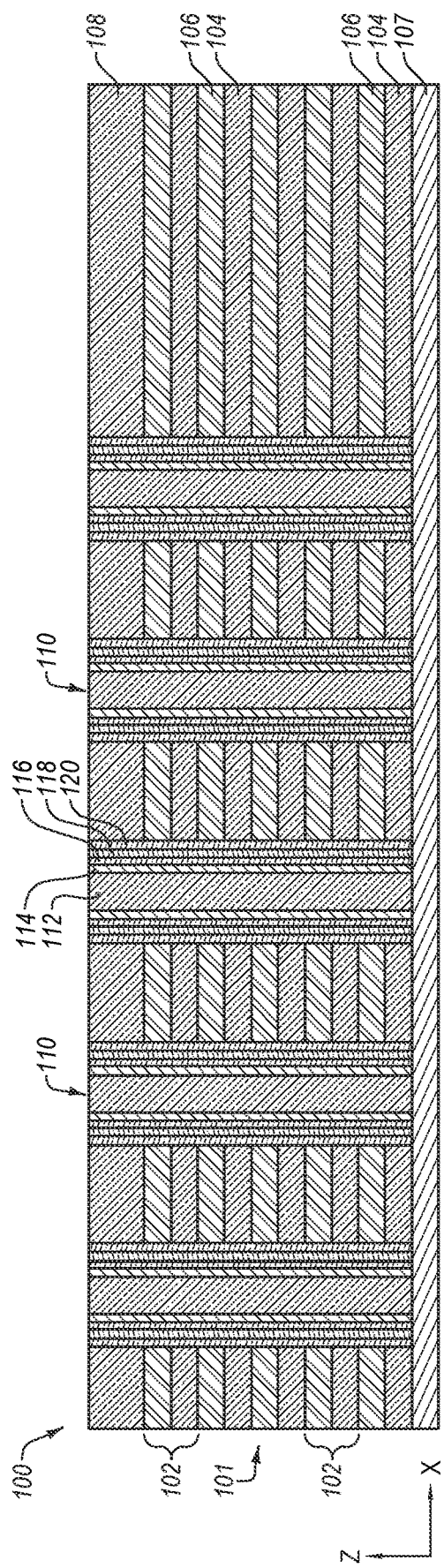
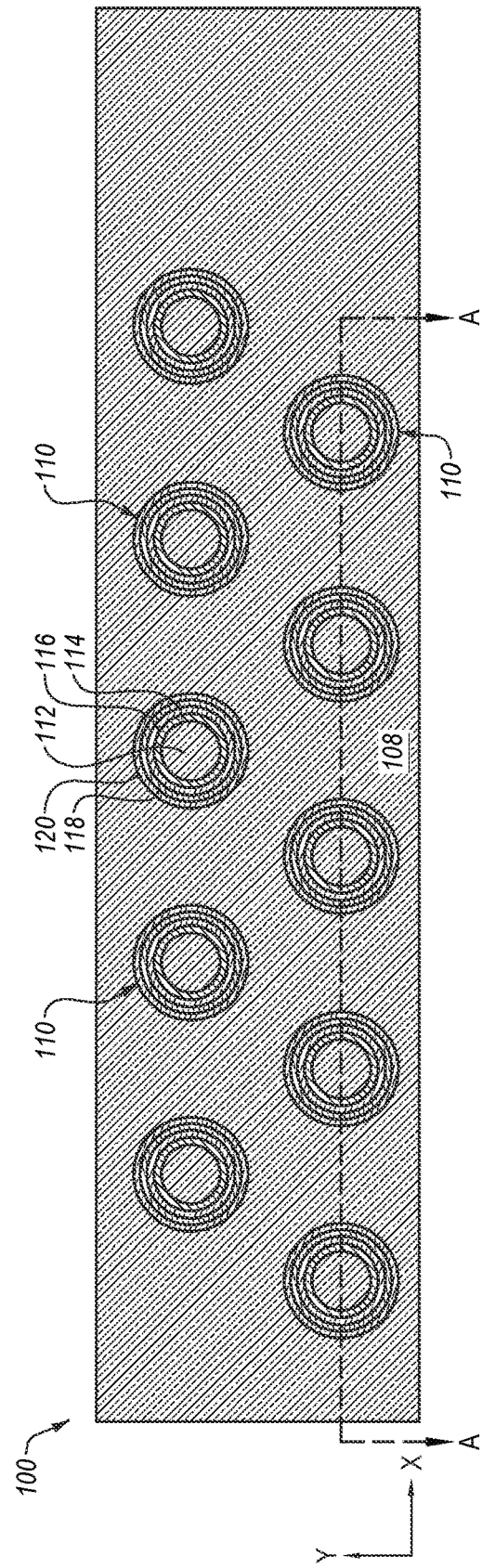
FIG. 1A
FIG. 1B

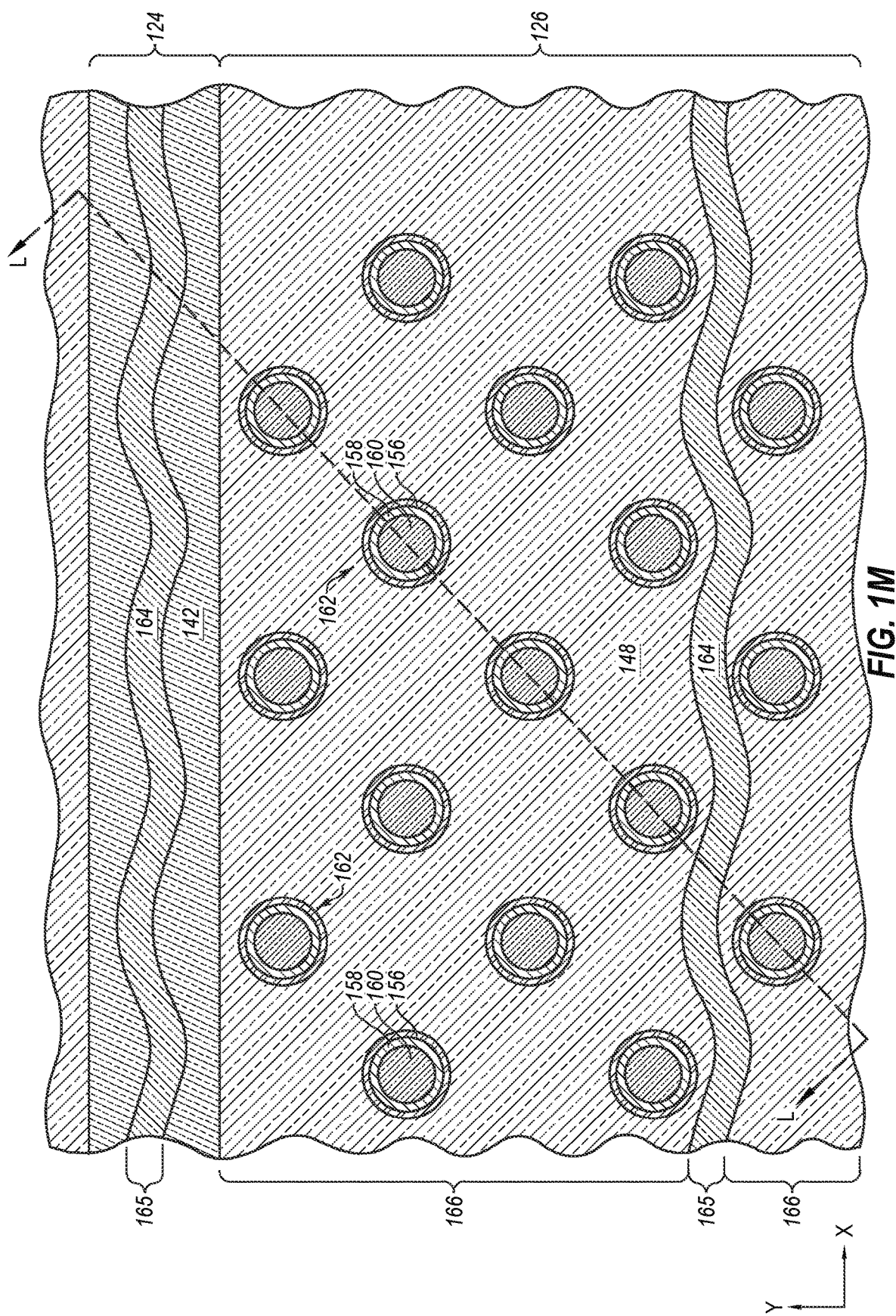

MICROELECTRONIC DEVICES INCLUDING CONDUCTIVE STRUCTURES

CROSS-REFERENCE TO RELATED APPLICATION

This application is a continuation of U.S. patent application Ser. No. 16/943,826, filed Jul. 30, 2020, now U.S. Pat. No. 11,527,546, issued Dec. 13, 2022, the disclosure of which is hereby incorporated herein in its entirety by this reference.

TECHNICAL FIELD

The disclosure, in various embodiments, relates generally to the field of microelectronic device design and fabrication. More specifically, the disclosure relates to microelectronic devices and apparatuses including some conductive structures exhibiting a greater conductivity than other conductive structures, and to related electronic systems and methods of forming the microelectronic devices.

BACKGROUND

A continuing goal of the microelectronics industry has been to increase the memory density (e.g., the number of memory cells per memory die) of memory devices, such as non-volatile memory devices (e.g., NAND Flash memory devices). One way of increasing memory density in non-volatile memory devices is to utilize vertical memory array (also referred to as a "three-dimensional (3D) memory array") architectures. A conventional vertical memory array includes vertical memory strings extending through openings in a stack of tiers of conductive structures (e.g., word lines) and dielectric materials at each junction of the vertical memory strings and the conductive structures. Such a configuration permits a greater number of switching devices (e.g., transistors) to be located in a unit of die area (i.e., length and width of active surface consumed) by building the array upwards (e.g., longitudinally, vertically) on a die, as compared to structures with conventional planar (e.g., two-dimensional) arrangements of transistors.

Conventional vertical memory arrays include electrical connections between the conductive structures and access lines (e.g., the word lines) so that memory cells in the vertical memory array can be uniquely selected for writing, reading, or erasing operations. One method of forming such an electrical connection includes forming so-called at least one "staircase" (or "stair step") structure at edges (e.g., horizontal ends) of the tiers of conductive structures. The staircase structure includes individual "steps" providing contact regions of the conductive structures upon which conductive contact structures can be positioned to provide electrical access to the conductive structures.

As vertical memory array technology has advanced, additional memory density has been provided by forming vertical memory arrays to include stacks comprising additional tiers of conductive structures and, hence, additional staircase structures and/or additional steps in individual staircase structures associated therewith. As the number of tiers of the conductive structures increases, processing conditions for the formation of the vertical memory strings extending through the stack becomes increasingly difficult. In addition, as the thickness of each tier decreases to increase the number of tiers within a given height of the stack, the resistivity of the conductive structures may increase and the conductivity may exhibit a corresponding decrease. However, a reduction in the conductivity of the conductive structures may impact performance of the stings of memory cells.

BRIEF DESCRIPTION OF THE DRAWINGS

FIG. 1A through FIG. 1M are simplified cross-sectional views (FIG. 1A,
FIG. 1C, FIG. 1D, and FIG. 1F through FIG. 1L) and top views (FIG. 1B, FIG. 1E, and
FIG. 1M) illustrating a method of forming a microelectronic device, in accordance with embodiments of the disclosure.

DETAILED DESCRIPTION

Figure 1C:
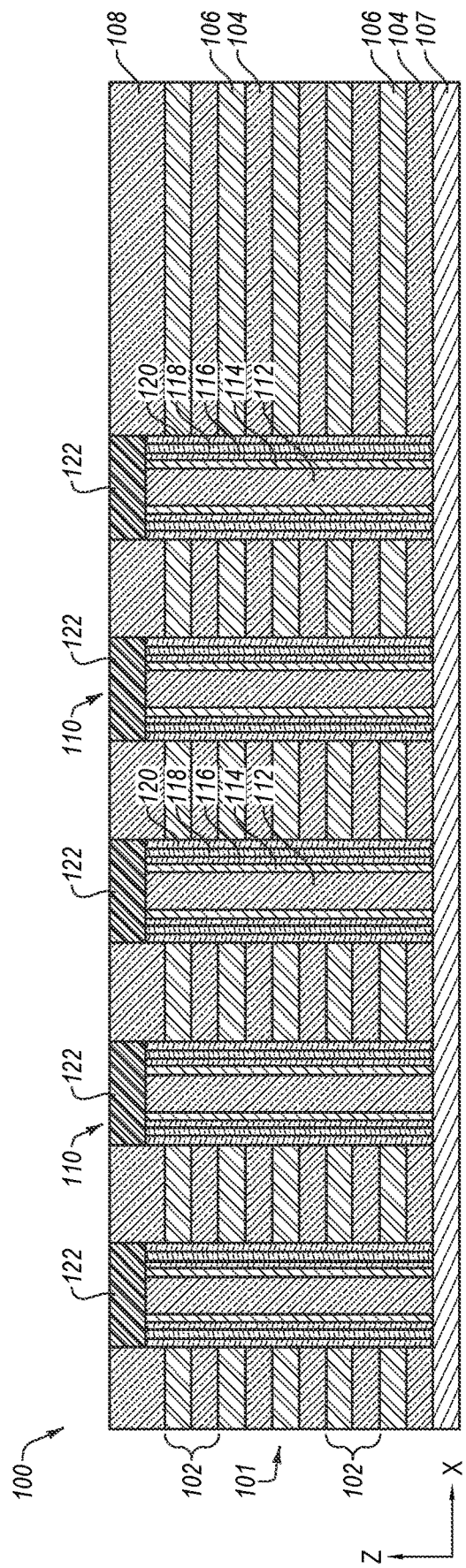

The illustrations included herewith are not meant to be actual views of any particular systems, microelectronic structures, microelectronic devices, or integrated circuits thereof, but are merely idealized representations that are employed to describe embodiments herein. Elements and features common between figures may retain the same numerical designation except that, for ease of following the description, reference numerals begin with the number of the drawing on which the elements are introduced or most fully described.

The following description provides specific details, such as material types, material thicknesses, and processing conditions in order to provide a thorough description of embodiments described herein. However, a person of ordinary skill in the art will understand that the embodiments disclosed herein may be practiced without employing these specific details. Indeed, the embodiments may be practiced in conjunction with conventional fabrication techniques employed in the semiconductor industry. In addition, the description provided herein does not form a complete process flow for manufacturing a microelectronic device (e.g., a semiconductor device, a memory device, such as DRAM memory device), apparatus, memory device, or electronic system, or a complete microelectronic device, apparatus, memory device, or electronic system including some conductive structures (e.g., select gate structures) exhibiting a greater conductivity than other conductive structures. The structures described below do not form a complete microelectronic device, apparatus, memory device, or electronic system. Only those process acts and structures necessary to understand the embodiments described herein are described in detail below. Additional acts to form a complete microelectronic device, apparatus, memory device, or electronic system from the structures may be performed by conventional techniques.

Unless otherwise specified, materials described herein may be formed by conventional techniques including, but not limited to, spin coating, blanket coating, chemical vapor deposition (CVD), atomic layer deposition (ALD), plasma enhanced ALD, physical vapor deposition (PVD), plasma enhanced chemical vapor deposition (PECVD), or low pressure chemical vapor deposition (LPCVD). Alternatively, the materials may be grown in situ. Depending on the specific material to be formed, the technique for depositing or growing the material may be selected by a person of ordinary skill in the art. The removal of materials may be accomplished by any suitable technique including, but not limited to, etching, abrasive planarization (e.g., chemical-mechanical planarization), or other known methods unless the context indicates otherwise.

As used herein, the terms "longitudinal," "vertical," "lateral," and "horizontal" are in reference to a major plane of a substrate (e.g., base material, base structure, base construction, etc.) in or on which one or more structures and/or features are formed and are not necessarily defined by Earth's gravitational field. A "lateral" or "horizontal" direction is a direction that is substantially parallel to the major plane of the substrate, while a "longitudinal" or "vertical" direction is a direction that is substantially perpendicular to the major plane of the substrate. The major plane of the substrate is defined by a surface of the substrate having a relatively large area compared to other surfaces of the substrate.

As used herein, the term "substantially" in reference to a given parameter, property, or condition means and includes to a degree that one of ordinary skill in the art would understand that the given parameter, property, or condition is met with a degree of variance, such as within acceptable tolerances. By way of example, depending on the particular parameter, property, or condition that is substantially met, the parameter, property, or condition may be at least 90.0 percent met, at least 95.0 percent met, at least 99.0 percent met, at least 99.9 percent met, or even 100.0 percent met.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped, etc.) and the spatially relative descriptors used herein interpreted accordingly.

As used herein, features (e.g., regions, materials, structures, devices) described as "neighboring" one another means and includes features of the disclosed identity (or identities) that are located most proximate (e.g., closest to) one another. Additional features (e.g., additional regions, additional materials, additional structures, additional devices) not matching the disclosed identity (or identities) of the "neighboring" features may be disposed between the "neighboring" features. Put another way, the "neighboring" features may be positioned directly adjacent one another, such that no other feature intervenes between the "neighboring" features; or the "neighboring" features may be positioned indirectly adjacent one another, such that at least one feature having an identity other than that associated with at least one the "neighboring" features is positioned between the "neighboring" features. Accordingly, features described as "vertically neighboring" one another means and includes features of the disclosed identity (or identities) that are located most vertically proximate (e.g., vertically closest to) one another. Moreover, features described as "horizontally neighboring" one another means and includes features of the disclosed identity (or identities) that are located most horizontally proximate (e.g., horizontally closest to) one another.

As used herein, the term "memory device" means and includes microelectronic devices exhibiting memory functionality, but not necessarily limited to memory functionality. Stated another way, and by way of example only, the term "memory device" means and includes not only conventional memory (e.g., conventional volatile memory, such as conventional dynamic random access memory (DRAM); conventional non-volatile memory, such as conventional NAND memory), but also includes an application specific integrated circuit (ASIC) (e.g., a system on a chip (SoC)), a microelectronic device combining logic and memory, and a graphics processing unit (GPU) incorporating memory.

As used herein, "conductive material" means and includes electrically conductive material such as one or more of a metal (e.g., tungsten (W), titanium (Ti), molybdenum (Mo), niobium (Nb), vanadium (V), hafnium (Hf), tantalum (Ta), chromium (Cr), zirconium (Zr), iron (Fe), ruthenium (Ru), osmium (Os), cobalt (Co), rhodium (Rh), iridium (Jr), nickel (Ni), palladium (Pd), platinum (Pt), copper (Cu), silver (Ag), gold (Au), aluminum (Al)), an alloy (e.g., a Co-based alloy, an Fe-based alloy, an Ni-based alloy, an Fe— and Ni-based alloy, a Co— and Ni-based alloy, an Fe— and Co-based alloy, a Co— and Ni— and Fe-based alloy, an Al-based alloy, a Cu-based alloy, a magnesium (Mg)-based alloy, a Ti-based alloy, a steel, a low-carbon steel, a stainless steel), a conductive metal-containing material (e.g., a conductive metal nitride, a conductive metal silicide, a conductive metal carbide, a conductive metal oxide), and a conductively-doped semiconductor material (e.g., conductively-doped polysilicon, conductively-doped germanium (Ge), conductively-doped silicon germanium (SiGe)). In addition, a "conductive structure" means and includes a structure formed of and including a conductive material.

As used herein, "insulative material" means and includes electrically insulative material, such one or more of at least one dielectric oxide material (e.g., one or more of a silicon oxide ($SiO_x$), phosphosilicate glass, borosilicate glass, borophosphosilicate glass, fluorosilicate glass, an aluminum oxide ($AlO_x$), a hafnium oxide ($HfO_x$), a niobium oxide ($NbO_x$), a titanium oxide ($TiO_x$), a zirconium oxide ($ZrO_x$), a tantalum oxide ($TaO_x$), and a magnesium oxide ($MgO_x$), at least one dielectric nitride material (e.g., a silicon nitride ($SiN_y$)), at least one dielectric oxynitride material (e.g., a silicon oxynitride ($SiO_xN_y$)), and at least one dielectric carboxynitride material (e.g., a silicon carboxynitride ($SiO_xC_zN_y$)). Formulae including one or more of "x," "y," and "z" herein (e.g., $SiO_x$, $AlO_x$, $HfO_x$, $NbO_x$, $TiO_x$, $SiN_y$, $SiO_xN_y$, $SiO_xC_zN_y$) represent a material that contains an average ratio of "x" atoms of one element, "y" atoms of another element, and "z" atoms of an additional element (if any) for every one atom of another element (e.g., Si, Al, Hf, Nb, Ti). As the formulae are representative of relative atomic ratios and not strict chemical structure, an insulative material may comprise one or more stoichiometric compounds and/or one or more non-stoichiometric compounds, and values of "x," "y," and "z" (if any) may be integers or may be non-integers. As used herein, the term "non-stoichiometric compound" means and includes a chemical compound with an elemental composition that cannot be represented by a ratio of well-defined natural numbers and is in violation of the law of definite proportions. In addition, an "insulative structure" means and includes a structure formed of and including an insulative material.

According to embodiments described herein, a microelectronic device comprises a first stack structure including alternating insulative structures and conductive structures arranged in tiers, each tier including an insulative structure and a conductive structure. Strings of memory cells comprising a channel material extend through the first stack structure, memory cells of the strings of memory cells located at intersections of the channel material and each of the conductive structures. The conductive structures of the first stack structure may comprise word lines of the memory cells. A second stack structure overlies the first stack structure and comprises alternating other insulative structures and other conductive structures arranged in tiers. The other conductive structures of the second stack structure may comprise select gate structures (SGSs) of the strings of memory cells. In some embodiments, a number of the tiers of the second stack structure is fewer than the number of the tiers of the first stack structure. In some embodiments, the other conductive structures may be formed by a different method than the conductive structures of the first stack structure and may exhibit different properties than the conductive structures of the first stack structure. In some embodiments, the conductive structures of the first stack structure are formed by atomic layer deposition and the other conductive structures of the second stack structure are formed by physical vapor deposition. The other conductive structures may be more electrically conductive (e.g., may exhibit a lower resistivity) than the conductive structures of the first stack structure. In some embodiments, the other conductive structures of the second stack structure may include fewer voids, exhibit a larger grain size, and exhibit fewer impurities (e.g., fluorine, moisture) than the conductive structures of the first stack structure.

In some embodiments, the second stack structure is formed over the first stack structure after forming the strings of memory cells. The conductive structures of the first stack structure may be formed by a so-called replacement gate process, wherein sacrificial (e.g., insulative) structures are replaced by the conductive structures. Forming the second stack structure after forming the strings of memory cells may facilitate improved uniformity of the strings of memory cells since the strings of memory cells may be formed through fewer levels of insulative structures and conductive structures compared to conventional microelectronic devices in which select gate structures are formed concurrently with the stings of memory cells. In other words, forming the other conductive structures after forming the strings of memory cells may facilitate formation of the strings of memory cells through a stack structure having a smaller height (but a same number of memory cells) compared to conventional microelectronic devices. In addition, forming the second stack structure after forming the strings of memory cells may facilitate forming the other conductive structures by a different method (e.g., physical vapor deposition) than the conductive structures. In some embodiments, the other conductive structures are formed directly (e.g., without a replacement process). The increased electrical conductivity of the other conductive structures may improve performance of the associated strings of memory cells.

FIG. 1A through FIG. 1M illustrate a method of forming a microelectronic device structure, in accordance with embodiments of the disclosure. FIG. 1A is a simplified cross-sectional view of a microelectronic device structure 100, in accordance with embodiments of the disclosure. The cross-section of the microelectronic device structure 100 illustrated in FIG. 1A is taken through section line B-B of FIG. 1B, which is a top view of the microelectronic device structure 100 of FIG. 1A. The microelectronic device structure 100 may include a stack structure 101 (which may also be referred to herein as a "first stack structure") including a vertically (e.g., in the Z-direction) alternating sequence of insulative structures 104 and other insulative structures 106 arranged in tiers 102. Each of the tiers 102 may individually include a level of an insulative structure 104 directly vertically adjacent a level of the other insulative structures 106. The insulative structures 104 of the stack structure 101 may also be referred to herein as "insulative materials" and the other insulative structures 106 of the stack structure 101 may also be referred to herein as "other insulative materials."

In some embodiments, a number (e.g., quantity) of tiers 102 of the stack structure 101 may be within a range from 32 to 256 of the tiers 102. In some embodiments, the stack structure 101 includes 128 of the tiers 102. However, the disclosure is not so limited, and the stack structure 101 may include a different number of the tiers 102. In addition, in some embodiments, the stack structure 101 comprises a first deck structure vertically overlying a source structure 107 and comprising tiers 102 of the insulative structures 104 and the other insulative structures 106, and a second deck structure over the first deck structure, the second deck structure comprising tiers 102 of the insulative structures 104 and the other insulative structures 106. For example, the stack structure 101 may comprise a dual deck 3D NAND device (e.g., a 3D NAND Flash memory device).

The levels of the insulative structures 104 may be formed of and include, for example, at least one dielectric material, such as one or more of an oxide material (e.g., silicon dioxide ($SiO_2$), phosphosilicate glass, borosilicate glass, borophosphosilicate glass, fluorosilicate glass, titanium dioxide ($TiO_2$), hafnium oxide ($HfO_2$), zirconium dioxide ($ZrO_2$), hafnium dioxide ($HfO_2$), tantalum oxide ($TaO_2$), magnesium oxide (MgO), and aluminum oxide ($Al_2O_3$)). In some embodiments, the insulative structures 104 are formed of and include silicon dioxide.

The levels of the other insulative structures 106 may be formed of and include an insulative material that is different than, and exhibits an etch selectivity with respect to, the insulative structures 104. In some embodiments, the other insulative structures 106 are formed of and include a nitride material (e.g., silicon nitride ($Si_3N_4$)) or an oxynitride material (e.g., silicon oxynitride). In some embodiments, the other insulative structures 106 comprise silicon nitride.

The stack structure 101 may be formed over the source structure 107 (e.g., a source plate). The source structure 107 may be formed of and include, for example, a semiconductor material doped with one of P-type conductivity materials (e.g., polysilicon doped with at least one P-type dopant (e.g., boron ions)) or N-type conductivity materials (e.g., polysilicon doped with at least one N-type dopant (e.g., arsenic ions, phosphorous ions, antimony ions)). Although FIG. 1A has been described and illustrated as including the stack structure 101 directly over (e.g., on) the source structure 107, the disclosure is not so limited. In other embodiments and as described above, the stack structure 101 overlies a deck structure (e.g., a first deck structure) comprising additional tiers 102 of insulative structures 104 and other insulative structures 106 separated from the stack structure 101 by at least one dielectric material.

A dielectric material 108 may be located over an uppermost one of the tiers 102. The dielectric material 108 may be formed of and include an electrically insulative material, such as, for example, one or more of phosphosilicate glass (PSG), borosilicate glass (BSG), fluorosilicate glass (FSG), borophosphosilicate glass (BPSG), and silicon dioxide. In some embodiments, the dielectric material 108 comprises the same material composition as the insulative structures 104. In some embodiments, the dielectric material 108 comprises silicon dioxide.

Pillars 110 of materials may vertically extend (e.g., in the Z-direction) through the stack structure 101. As will be described herein, the materials of the pillars 110 may form memory cells (e.g., strings of NAND memory cells). The pillars 110 may each individually comprise an insulative material 112, a channel material 114 horizontally adjacent to the insulative material 112, a tunnel dielectric material (also referred to as a "tunneling dielectric material") 116 horizontally adjacent to the channel material 114, a memory material 118 horizontally adjacent to the tunnel dielectric material 116, and a dielectric blocking material (also referred to as a "charge blocking material") 120 horizontally adjacent to the memory material 118. The dielectric blocking material 120 may be horizontally adjacent to one of the levels of other insulative structures 106 of one of the tiers 102 of the stack structure 101. The channel material 114 may be horizontally interposed between the insulative material 112 and the tunnel dielectric material 116; the tunnel dielectric material 116 may be horizontally interposed between the channel material 114 and the memory material 118; the memory material 118 may be horizontally interposed between the tunnel dielectric material 116 and the dielectric blocking material 120; and the dielectric blocking material 120 may be horizontally interposed between the memory material 118 and a level of the other insulative structure 106.

The insulative material 112 may be formed of and include an electrically insulative material such as, for example, phosphosilicate glass (PSG), borosilicate glass (BSG), fluorosilicate glass (FSG), borophosphosilicate glass (BPSG), silicon dioxide, titanium dioxide, zirconium dioxide, hafnium dioxide, tantalum oxide, magnesium oxide, aluminum oxide, niobium oxide, molybdenum oxide, strontium oxide, barium oxide, yttrium oxide, a nitride material, (e.g., silicon nitride ($Si_3N_4$)), an oxynitride (e.g., silicon oxynitride), a dielectric carbon nitride material (e.g., silicon carbon nitride (SiCN)), a dielectric carboxynitride material (e.g., silicon carboxynitride (SiOCN)), or combinations thereof. In some embodiments, the insulative material 112 comprises silicon dioxide.

The channel material 114 may be formed of and include one or more of a semiconductor material (at least one elemental semiconductor material, such as polycrystalline silicon; at least one III-V compound semiconductor material, at least one II-VI compound semiconductor material, at least one organic semiconductor material, GaAs, InP, GaP, GaN, other semiconductor materials), and an oxide semiconductor material. In some embodiments, the channel material 114 includes amorphous silicon or polysilicon. In some embodiments, the channel material 114 comprises a doped semiconductor material.

The tunnel dielectric material 116 may be formed of and include a dielectric material through which charge tunneling can be performed under suitable electrical bias conditions, such as through hot-carrier injection or by Fowler-Nordheim tunneling induced charge transfer. By way of non-limiting example, the tunnel dielectric material 116 may be formed of and include one or more of silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In some embodiments, the tunnel dielectric material 116 comprises silicon dioxide. In other embodiments, the tunnel dielectric material 116 comprises silicon oxynitride.

The memory material 118 may comprise a charge trapping material or a conductive material. The memory material 118 may be formed of and include one or more of silicon nitride, silicon oxynitride, polysilicon (doped polysilicon), a conductive material (tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof), a semiconductive material polycrystalline or amorphous semiconductor material including at least one elemental semiconductor element or at least one compound semiconductor material, conductive nanoparticles (e.g., ruthenium nanoparticles), metal dots. In some embodiments, the memory material 118 comprises silicon nitride.

The dielectric blocking material 120 may be formed of and include a dielectric material such as, for example, one or more of an oxide (e.g., silicon dioxide), a nitride (silicon nitride), and an oxynitride (silicon oxynitride), or another material. In some embodiments, the dielectric blocking material 120 comprises silicon oxynitride.

In some embodiments the tunnel dielectric material 116, the memory material 118, and the dielectric blocking material 120 together may comprise a structure configured to trap a charge, such as, for example, an oxide-nitride-oxide (ONO) structure. In some such embodiments, the tunnel dielectric material 116 comprises silicon dioxide, the memory material 118 comprises silicon nitride, and the dielectric blocking material 120 comprises silicon dioxide.

Referring to FIG. 1B, pillars 110 that are adjacent one another in the Y-direction may be offset from each other in the X-direction. Accordingly, the pillars 110 may be arranged in a so-called weave pattern, which may facilitate an increased density of the pillars 110 (and the resulting strings of memory cells) in the stack structure 101. However, the disclosure is not so limited and the pillars 110 may be arranged in other patterns (e.g., lines wherein the pillars 110 of each line are aligned with pillars 110 of each of the other lines).

With reference to FIG. 1C, after forming the pillars 110, a portion of the pillars 110 may be removed to recess the pillars 110 relative to an uppermost surface of the dielectric material 108. In some embodiments, an etch stop material 122 may be formed within the recesses. The etch stop material 122 may be formed of and include one or more materials formulated and configured to exhibit an etch selectivity with respect to one or more materials of the stack structure 101 (e.g., one or more of the insulative structures and other insulative structures). The etch stop material 122 may include one or more of aluminum oxide ($Al_2O_3$), tungsten, a nitride material (e.g., titanium nitride, tungsten nitride). In some embodiments, the etch stop material 122 comprises aluminum oxide. Although FIG. 1C has been described and illustrated as forming a recess in the pillars 110 and forming the etch stop material 122 in the recesses, the disclosure is not so limited. In other embodiments, a dielectric material may be formed over the stack structure 101 and openings may be formed in the dielectric material at locations corresponding to the pillars 110. The etch stop material 122 may be formed within the openings in the dielectric material.

Figure 1D:
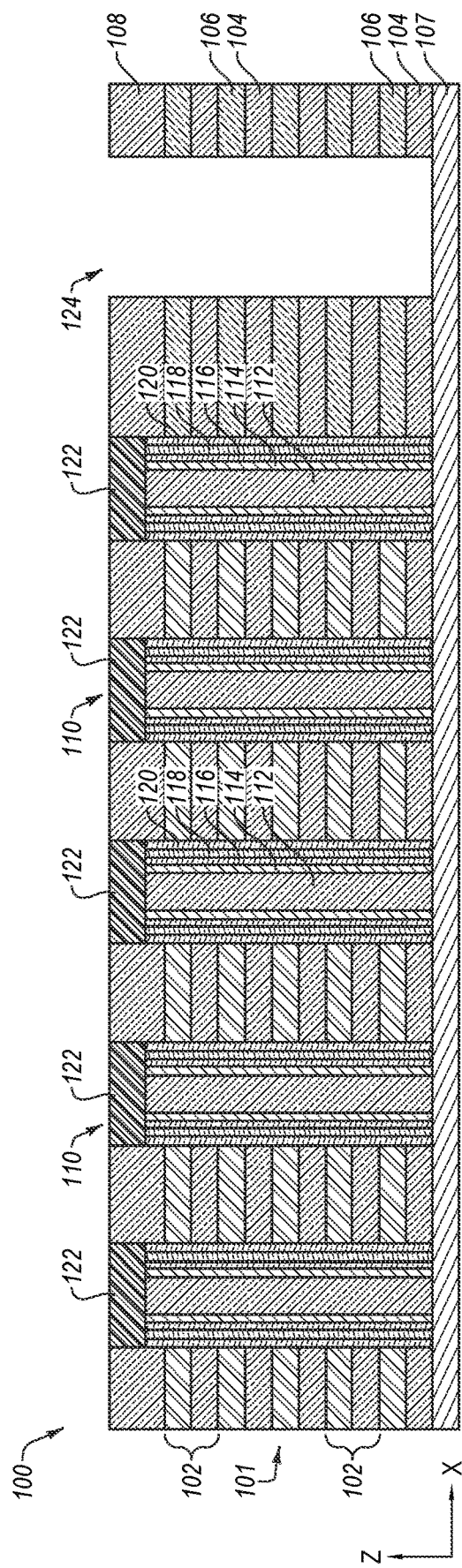
Figure 1E:
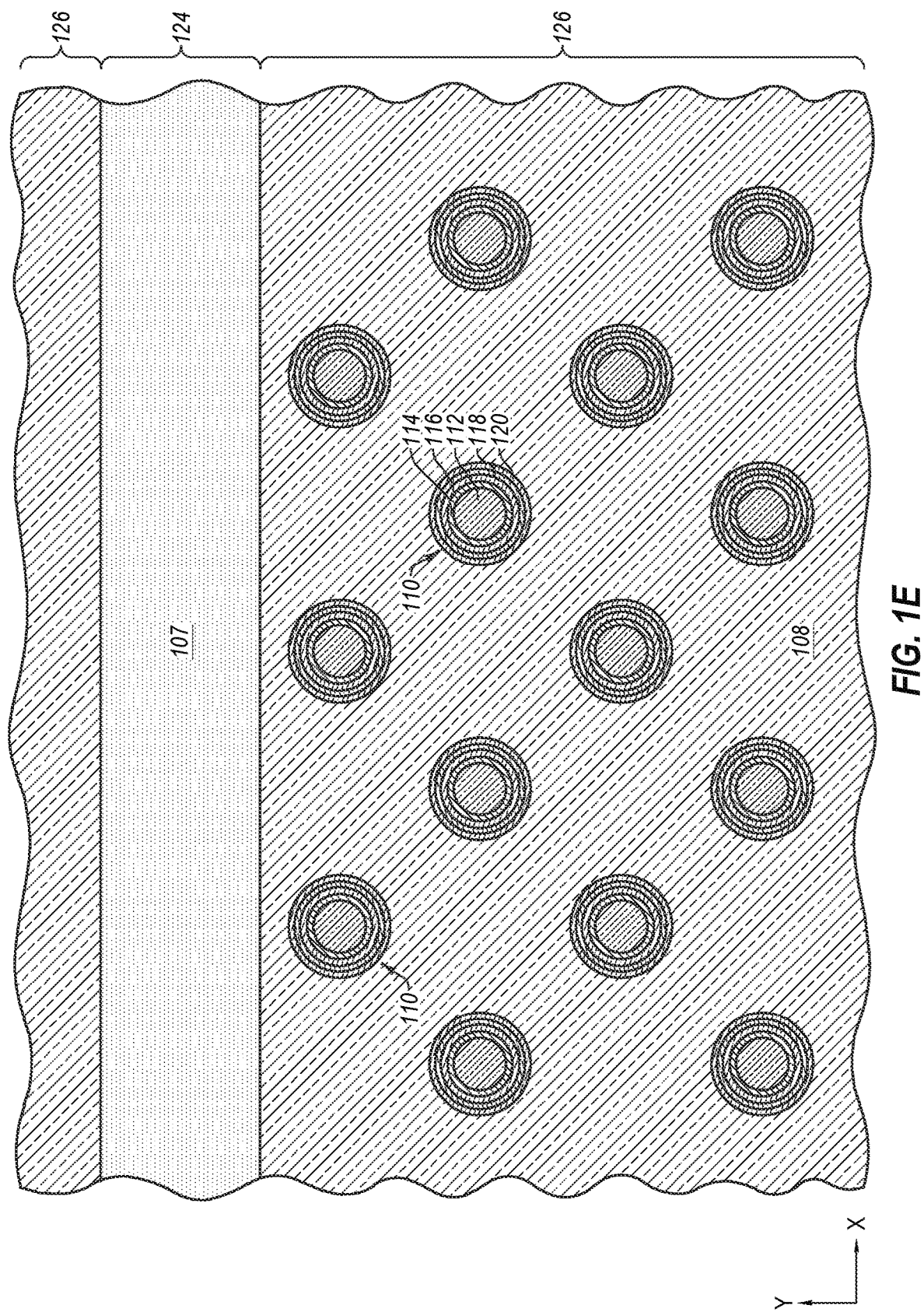

Referring to FIG. 1D, after forming the etch stop material 122, slots 124, which may also be referred to as a "slits" or a "replacement gate slots" may be formed through the stack structure 101. FIG. 1E is a top view of the microelectronic device structure 100 of FIG. 1D, but illustrating the components of the pillar 110 under the etch stop material 122 (FIG. 1D). In some embodiments, the slots 124 may be formed through the stack structure 101 and expose a portion of the source structure 107. The slots 124 may be formed by, for example, exposing the microelectronic device structure 100 to one or more etchants to selectively remove the dielectric material, the insulative structures 104, and the other insulative structures 106.

With reference to FIG. 1E, the slots 124 may divide the microelectronic device structure 100 into separate blocks 126, each block 126 including a plurality of the pillars 110.

Figure 1F:
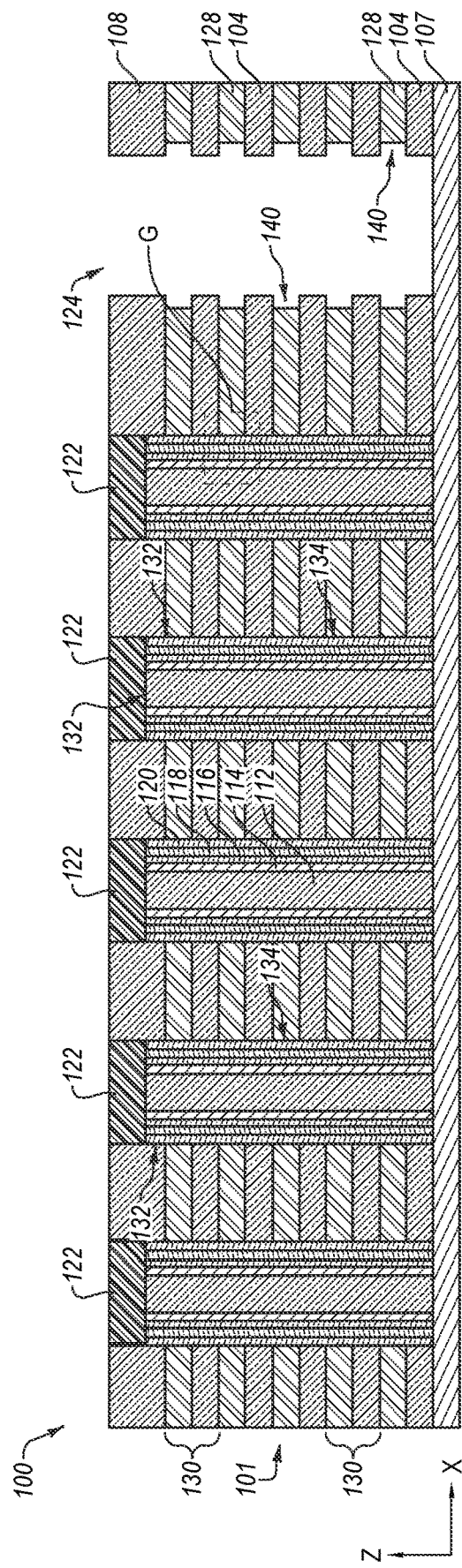

Referring to FIG. 1F, after forming the slots 124, the other insulative structures 106 (FIG. 1D) of the stack structure 101 may be removed through the slot 124 as part of a so-called "replacement gate" or "gate last" process. By way of non-limiting example, the other insulative structures 106 may be removed by exposing the other insulative structures 106 to a wet etchant comprising one or more of phosphoric acid, sulfuric acid, hydrochloric acid, nitric acid, or another material. In some embodiments, the other insulative structures 106 are removed by exposing the other insulative structures 106 to a so-called "wet nitride strip" comprising a wet etchant comprising phosphoric acid.

After removal of the other insulative structures 106, conductive structures 128 (also referred to herein as "first conductive structures") may be formed between the adjacent insulative structures 104 at locations corresponding to the locations of the other insulative structures 106 to form tiers 130 of alternating levels of the insulative structures 104 and the conductive structures 128 and strings 132 of memory cells 134 extending through the stack structure 101.

In some embodiments, the conductive structures 128 comprise word lines of the strings 132 of memory cells 134. In some embodiments, a lowermost one of the conductive structures 128 comprises a select gate structure (e.g., a select gate source (SGS) structure).

The conductive structures 128 may be formed of and include an electrically conductive material, such as at least one electrically conductive material, such as, for example, tungsten, titanium, nickel, platinum, rhodium, ruthenium, iridium, aluminum, copper, molybdenum, silver, gold, a metal alloy, a metal-containing material (e.g., metal nitrides, metal silicides, metal carbides, metal oxides), a material including at least one of titanium nitride (TiN), tantalum nitride (TaN), tungsten nitride (WN), titanium aluminum nitride (TiAlN), iridium oxide ($IrO_x$), ruthenium oxide ($RUO_x$), alloys thereof, a conductively-doped semiconductor material (e.g., conductively-doped silicon, conductively-doped germanium, conductively-doped silicon germanium, etc.), polysilicon, other materials exhibiting electrical conductivity, or combinations thereof. In some embodiments, the conductive structures 128 comprise tungsten.

In some embodiments, the conductive structures 128 are formed by atomic layer deposition. In some such embodiments, the conductive structures 128 are formed with precursors comprising tungsten hexafluoride ($WF_6$) and silane ($SiH_4$) to form the conductive structures 128. Accordingly, in some embodiments, the conductive structures 128 are formed with halogen-containing precursors. In some such embodiments, the conductive structures 128 may include at least some of the halogen (e.g., fluorine).

Figure 1G:
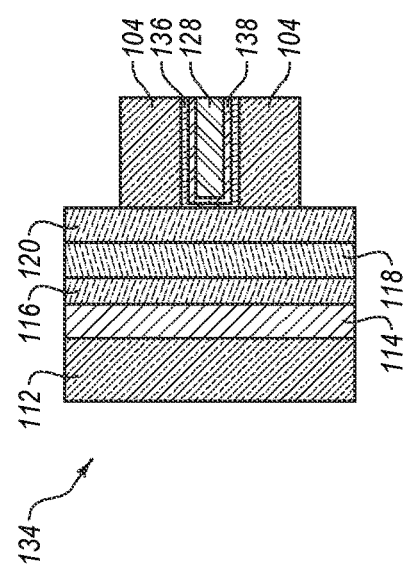

Intersections of the conductive structures 128 and the strings 132 may form individual memory cells 134. FIG. 1G illustrates an enlarged portion of box G of FIG. 1F and illustrates a memory cell 134, in accordance with embodiments of the disclosure. With reference to FIG. 1G, the memory cells 134 may each include the channel material 114, the tunnel dielectric material 116 horizontally neighboring the channel material 114, the memory material 118 horizontally neighboring the tunnel dielectric material, the dielectric blocking material 120, and the conductive structures 128 horizontally neighboring the dielectric blocking material 120.

In some embodiments, and as illustrated in FIG. 1G, a dielectric barrier material 136 may be formed directly neighboring the dielectric blocking material 120 and directly neighboring the insulative structures 104. A conductive liner material 138 may directly neighbor the dielectric barrier material 136 and the conductive structures 128. For ease of illustration and understanding, the dielectric barrier material 136 and the conductive liner material 138 are not illustrated in FIG. 1F, but it will be understood that the microelectronic device structure 100 may include one or both of the dielectric barrier material 136 and the conductive liner material 138.

The conductive liner material 138 may be formed of and include a seed material from which the conductive structures 128 may be formed. The conductive liner material 138 may be formed of and include, for example, a metal (e.g., titanium, tantalum), a metal nitride (e.g., tungsten nitride, titanium nitride, tantalum nitride), or another material. In some embodiments, the conductive liner material 138 comprises titanium nitride.

The dielectric barrier material 136 may be formed of and include one or more of a metal oxide (e.g., one or more of aluminum oxide, hafnium oxide, zirconium oxide, lanthanum oxide, yttrium oxide, tantalum oxide, gadolinium oxide, niobium oxide, titanium oxide), a dielectric silicide (e.g., aluminum silicide, hafnium silicate, zirconium silicate, lanthanum silicide, yttrium silicide, tantalum silicide), and a dielectric nitride (e.g., aluminum nitride, hafnium nitride, lanthanum nitride, yttrium nitride, tantalum nitride). In some embodiments, the dielectric barrier material 136 comprises aluminum oxide.

With reference back to FIG. 1F, after forming the dielectric barrier material 136, the conductive liner material 138, and the conductive structures 128, a portion of the conductive structures 128, the conductive liner material 138, and the dielectric barrier material 136 may be removed from surfaces of the slots 124 to form recessed portions 140 of the conductive structures 128 and to electrically isolate neighboring conductive structures 128 from one another. In other words, removal of the portion of the conductive structures 128, the conductive liner material 138, and the dielectric barrier material 136 may physically and electrically isolate the conductive structures 128 from each other.

In some embodiments, the conductive liner material 138 and the conductive material of the conductive structures 128 are removed by exposing the conductive liner material 138 and the conductive material of the conductive structures 128 to one or more wet etchants through the slot 124. The wet etchants may include one or more of phosphoric acid, acetic acid, nitric acid, hydrochloric acid, aqua regia, or hydrogen peroxide. However, the disclosure is not so limited and the conductive liner material 138 and the conductive material of the conductive structures 128 may be removed with other etchants. In some embodiments, the conductive liner material 138 may be removed by exposure to one or more dry etchants, such as one or more chlorine-containing dry etchants. By way of non-limiting example, the one or more dry etchants may include one or more of chlorine gas, boron trichloride (BCL$_3$), oxygen, and argon. In some embodiments, the conductive liner material 138 is removed by exposure to a dry etchant comprising chlorine gas and boron trichloride.

Figure 1H:
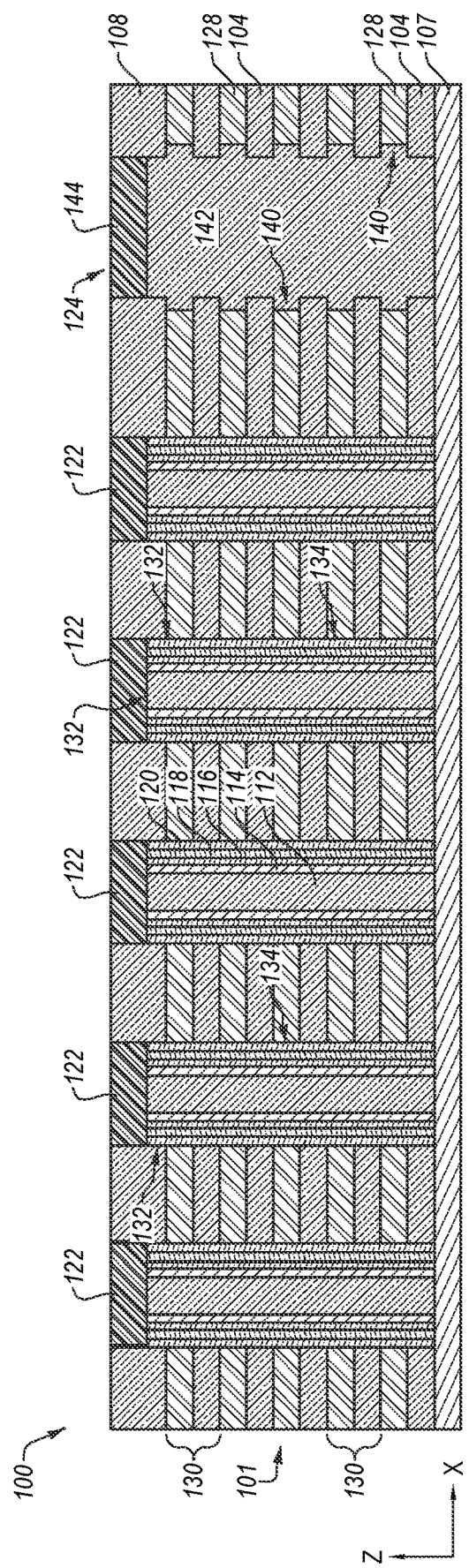

Referring now to FIG. 1H, the slots 124 may be filled with a dielectric material 142. The dielectric material 142 may extend through the stack structure 101. In addition, the dielectric material 142 may be located between adjacent blocks 126 at locations correspond to the slots 124.

The dielectric material 142 may be formed of and include one or more of the materials described above with reference to the dielectric material 108. For example, the dielectric material 142 may be formed of and include one or more of phosphosilicate glass (PSG), borosilicate glass (BSG), fluorosilicate glass (FSG), borophosphosilicate glass (BPSG), and silicon dioxide. In some embodiments, the dielectric material 142 comprises silicon dioxide.

After forming the dielectric material 142, a portion of the dielectric material 142 may be recessed and filled with an etch stop material 144. The etch stop material 144 may be formed of and include one or more of the materials described above with reference to the etch stop material 122. In some embodiments, the etch stop material 144 comprises the same material composition as the etch stop material 122. In some embodiments, the etch stop material 144 comprises aluminum oxide.

Figure 1I:
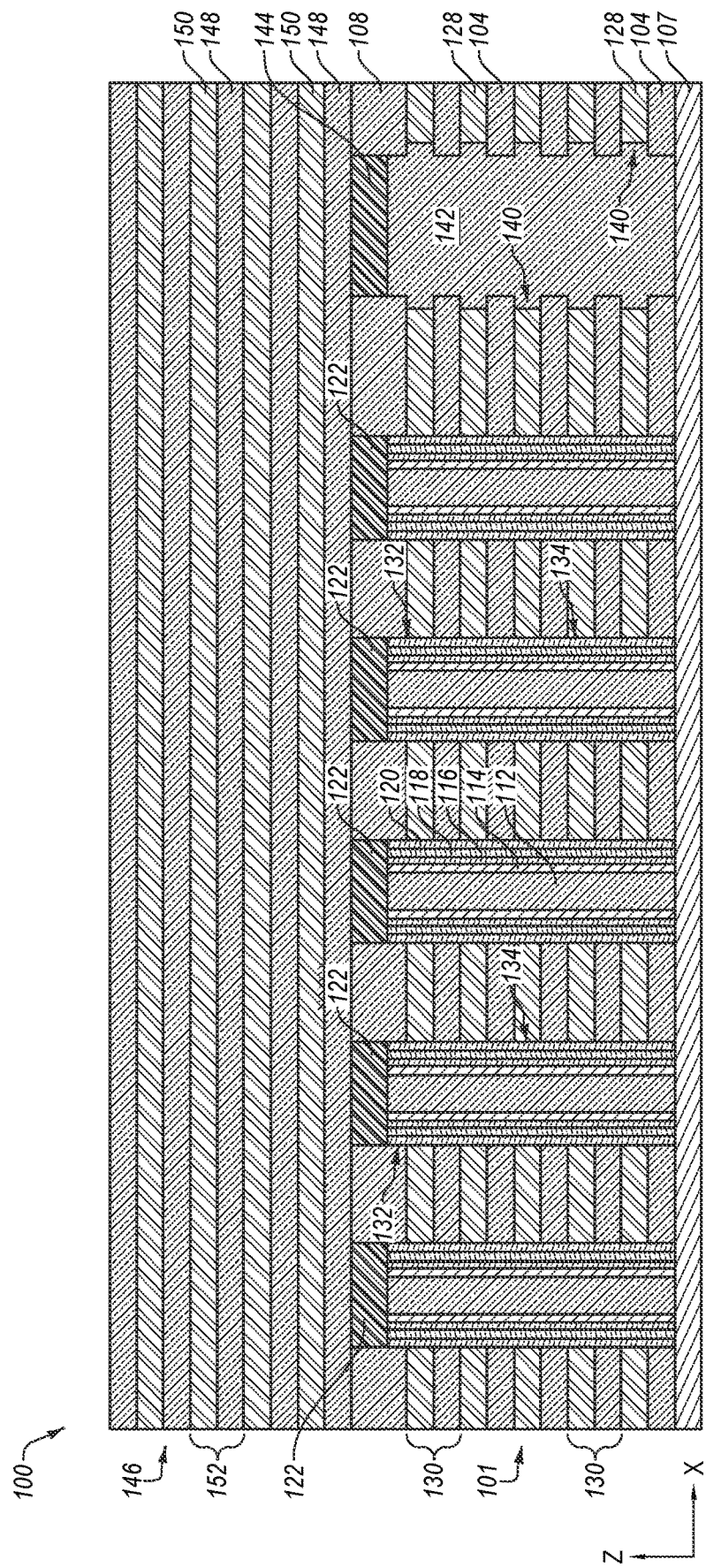

Referring now to FIG. 1I, another stack structure 146 including a vertically (e.g., in the Z-direction) alternating sequence of insulative structures 148 and conductive structures 150 (also referred to herein as "second conductive structures") arranged in tiers 152. Each of the tiers 152 may individually include a level of an insulative structure 148 directly vertically adjacent a level of the conductive structures 150. The insulative structures 148 of the another stack structure 146 may also be referred to as "insulative materials."

In some embodiments, a number of the tiers 152 may be fewer than the number of the tiers 130. In some embodiments, a number of the tiers 152 of the another stack structure 146 may be within a range from 2 to 12 of the tiers 152, such as from 2 to 4 of the tiers 152, from 4 to 6 of the tiers 152, or from 6 to 12 of the tiers 152. In some embodiments, the another stack structure 146 comprises 5 of the tiers 152. However, the disclosure is not so limited and the number of the tiers 152 may be different than those described.

The insulative structures 148 may be formed of and include an insulative material, such as one or more of the materials described above with reference to the insulative structures 104. In some embodiments, the insulative structures 148 comprise the same material composition as the insulative structures 104. In other embodiments, the insulative structures 148 comprise a different material composition than the insulative structures 104. In some embodiments, the insulative structures 148 comprise silicon dioxide.

The conductive structures 150 may each comprise select gate structures (e.g., upper select gates, select gate drain (SGD) structures).

The conductive structures 150 may be formed of and include a conductive material, such as one or more of the materials described above with reference to the conductive structures 128. By way of non-limiting example, the conductive structures 150 may include one or more of tungsten, titanium, nickel, platinum, rhodium, ruthenium, iridium, aluminum, copper, molybdenum, silver, gold, a metal alloy, a metal-containing material (e.g., metal nitrides, metal silicides, metal carbides, metal oxides), a material including at least one of titanium nitride (TiN), tantalum nitride (TaN), tungsten nitride (WN), titanium aluminum nitride (TiAlN), iridium oxide (IrO$_x$), ruthenium oxide (RUO$_x$), alloys thereof, a conductively-doped semiconductor material (e.g., conductively-doped silicon, conductively-doped germanium, conductively-doped silicon germanium, etc.), polysilicon, or other materials exhibiting electrical conductivity. In some embodiments, the conductive structures 150 comprise tungsten.

In some embodiments, the conductive structures 150 do not include (e.g., do not neighbor, are not associated with) a conductive liner material (e.g., such as the conductive liner material 138 (FIG. 1G)) or a dielectric barrier material (e.g., the dielectric barrier material 136 (FIG. 1G)) as described above with reference to the conductive structures 128.

In some embodiments, the conductive structures 150 are formed by PVD (e.g., sputtering) with a target comprising the material composition of the conductive structures 150. In some such embodiments, the conductive structures 150 may be formed by exposing a target comprising the material composition of the conductive structures 150 with an ionized gas (e.g., argon) to form (e.g., deposit) the conductive structures 150 of the stack structure 146. In some such embodiments, the conductive structures 150 may comprise a PVD grown conductive material and may be referred to herein as a "PVD conductive material" (e.g., PVD tungsten). In some embodiments, at least some argon may be present within the conductive structures 150.

In some embodiments, the conductive structures 150 comprise PVD grown tungsten. The conductive structures 128 may comprise tungsten exhibiting different properties than the conductive structures 150. For example, the conductive structures 150 may exhibit a different grain size, different electrical properties, and fewer impurities than the conductive structures 128.

In some embodiments, the conductive structures 150 may comprise tungsten having a larger grain size than a grain size of the conductive structures 128. Without wishing to be bound by any particular theory, it is believed that since the conductive structures 150 are formed by PVD (rather than ALD or CVD) and because the conductive structures 150 are formed sequentially with the insulative structures 148 (e.g., one structure at a time, rather than by replacement of multiple levels of sacrificial materials located between adjacent insulative structures 148 (e.g., such as the other insulative structure 106 (FIG. 1D) as during the formation of the conductive structures 128)), there is no volume constriction on the grain size of the conductive structures 150. By way of comparison, conductive structures formed by ALD or CVD may exhibit voids that may be formed by non-uniform formation of the conductive structures 128 and resulting "pinching off" of the flow of ALD and/or CVD precursors in between adjacent insulative structures. Such voids may result in conductive structures exhibiting relatively smaller grain size and a greater resistivity than PVD conductive structures.

As will be described herein, in some embodiments, the conductive structures 150 may exhibit a lower resistivity than the conductive structures 128. In some embodiments, the conductive structures 150 and the conductive structures 128 are each individually formed of and include tungsten.

The conductive structures 150 may exhibit fewer impurities than the conductive structures 128. In some embodiments, the conductive structures 150 may be substantially free of halogens and moisture. In some embodiments, the conductive structures 150 may include less fluorine and/or less moisture than the conductive structures 128. For example, in some embodiments, the conductive structures 150 are formed by PVD with a target comprising tungsten and are formed without use of fluorine-containing precursors. By way of contrast, conductive structures formed with fluorine-containing precursors, such as tungsten hexafluoride, may include at least some residual fluorine. In addition, the residual fluorine may react with moisture or other materials to form impurities in the conductive structures, reducing the conductivity thereof.

Figure 1J:
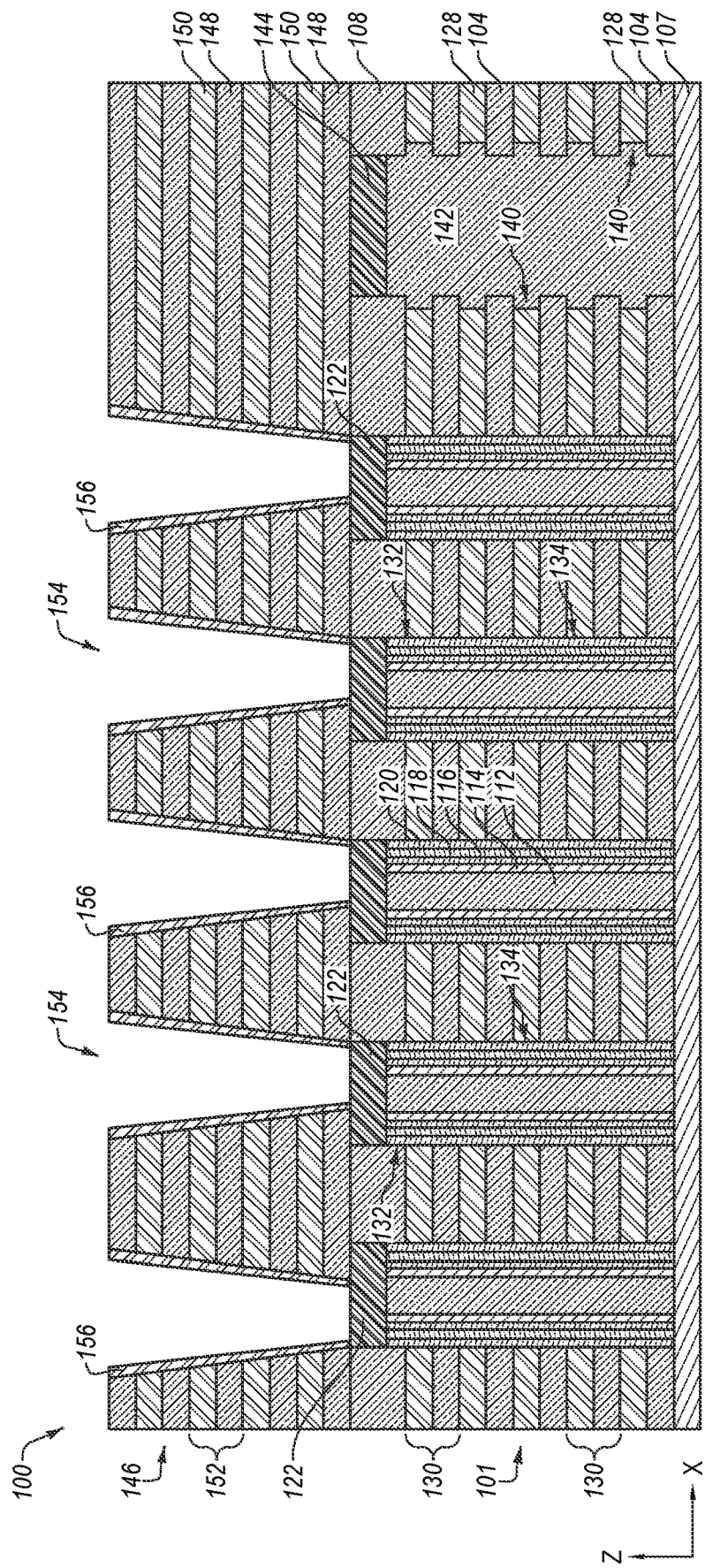

Referring to FIG. 1J, after forming the another stack structure 146, openings 154 may be formed through portions of the another stack structure 146 overlying the strings 132 of memory cells 134. The openings 154 may expose at least a portion (e.g., all of, only a portion of) the etch stop material 122.

The openings 154 may be formed by, for example, exposing the another stack structure 146 to one or more etchants formulated to remove the insulative structures 148 and the conductive structures 150 without substantially removing the etch stop material 122. By way of non-limiting example, portions of the insulative structures 148 may be removed by exposure to one or more dry etchants such as sulfur hexafluoride ($SF_6$), nitrogen trifluoride ($NF_3$), difluorocarbeen ($CF_2$), carbon tetrafluoride ($CF_4$), triflouromethane ($CHF_3$) (also referred to as fluoroform), hexafluoroethane ($C_2F_6$), perfluoropropane ($C_3F_8$), perfluorocyclopentene ($C_5F_8$), $O_2$, or another material. In other embodiments, the portions of the insulative structures 148 are removed with one or more wet etchants, such as one or more of hydrofluoric acid, ammonium fluoride, potassium hydroxide, or another material. Portions of the conductive structures 150 may be removed by exposure to a wet etchant comprising one or more of potassium hydroxide, ammonia ($NH_3$), or another etchant. In other embodiments, portions of the conductive structures 150 are removed by dry etching, such as exposure to one or more of $SF_6$, $NF_3$, $CF_2$, $CF_4$, $CHF_3$, $C_2F_6$, $C_3F_8$, $C5F_8$, $O_2$, $CBrF_3$, or another etchant. In some embodiments, the openings 154 are formed by exposing the another stack structure 146 to one or more dry etchants, such as one or more of $SF_6$, $NF_3$, $CF_2$, $CF_4$, $CHF_3$, $C_2F_6$, $C_3F_8$, $C5F_8$, $O_2$, $CBrF_3$.

With continued reference to FIG. 1J, after forming the openings 154, a conductive barrier material 156 may be formed within the openings 154. The conductive barrier material 156 may be formed by one or more of ALD, CVD, PECVD, LPCVD, and PVD. In some embodiments, the conductive barrier material 156 is formed substantially conformally over surfaces of the openings 154. The conductive barrier material 156 may contact levels of the insulative structures 148 and the conductive structures 150 of the tiers 152. In some embodiments, laterally extending portions (e.g., in the X-direction, in the Y-direction) of the conductive barrier material 156 at a lowermost (e.g., in the Z-direction) portion of the openings 154 may be removed to expose the etch stop material 122. The laterally extending portions of the conductive barrier material 156 may be removed by exposure to, for example, one or more of $Cl_2$, $CF_4$, and $O_2$.

The conductive barrier material 156 may reduce or substantially prevent diffusion and reaction between materials of the conductive structures 150 and other materials formed within the openings 154. For example, the conductive barrier material 156 may reduce or substantially prevent reaction of the conductive structures 150 and a source material from forming tungsten silicide, for example, during further processing of the microelectronic device structure 100. In some embodiments, the conductive barrier material 156 facilitates processing of the microelectronic device structure 100 at temperatures greater than about 750° C., such as greater than about 800° C., without substantially reacting the materials of the conductive structures 150 with the source material.

The conductive barrier material 156 may be formed of and include a conductive material. In some embodiments, the conductive barrier material 156 comprises titanium nitride.

Figure 1K:
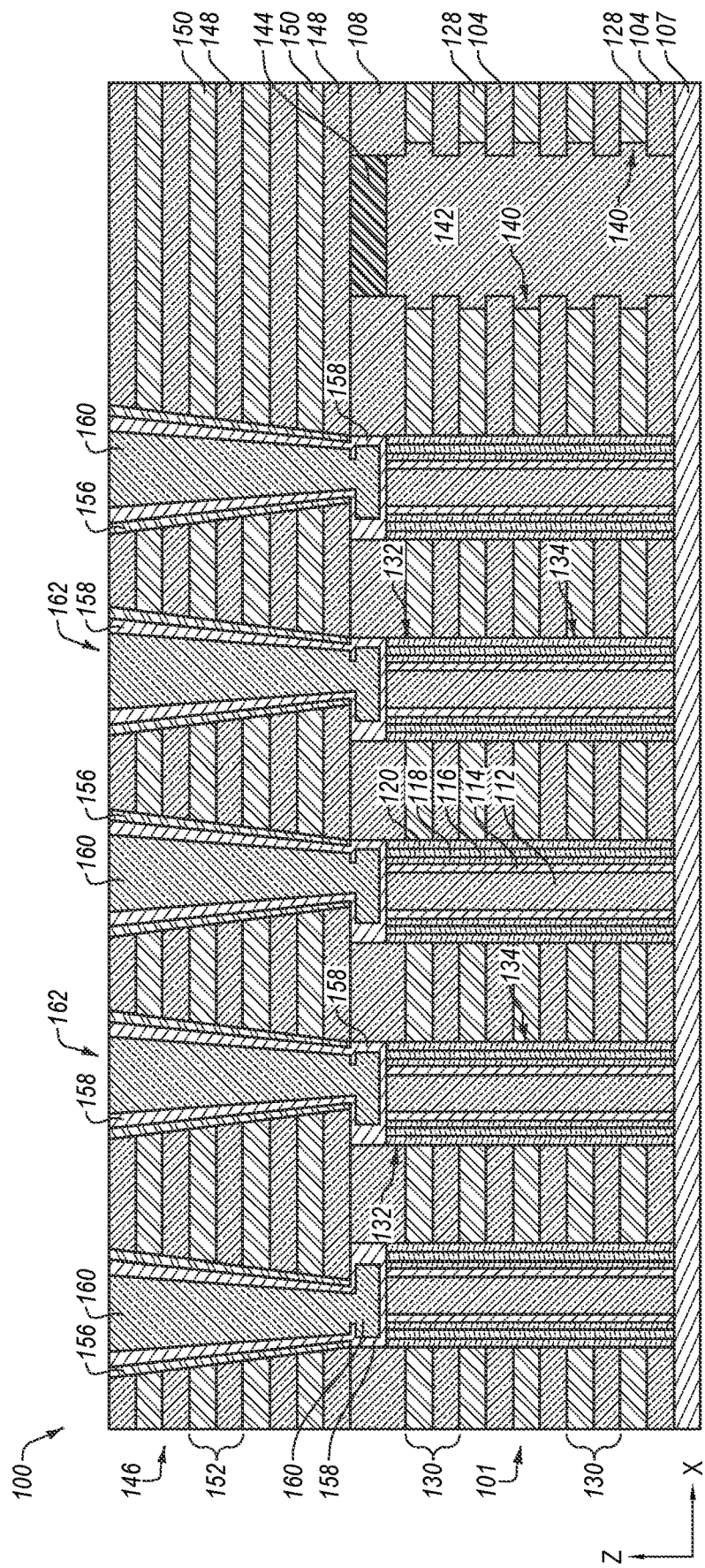

Referring to FIG. 1K, after forming the conductive barrier material 156, the etch stop material 122 (FIG. 1J) may be removed (e.g., exhumed) from over the strings 132 of memory cells 134. By way of non-limiting example, the etch stop material 122 may be removed by exposure to one or more of phosphoric acid, nitric acid, and acetic acid. However, the disclosure is not so limited and the etch stop material 122 may be removed by methods other than those described.

After removal of the etch stop material 122, a channel material 158 may be formed over the conductive barrier material 156. The channel material 158 may be substantially continuous with the channel material 114 of the strings 132 of memory cells 134. In some embodiments, the channel material 158 and the channel material 114 may be collectively referred to herein as the channel material 114.

The channel material 158 may be formed of and include one or more of the materials described above with reference to the channel material 114. In some embodiments, the channel material 158 comprises the same material composition as the channel material 114. In some embodiments, the channel material 158 comprises polysilicon (e.g., doped polysilicon).

After forming the channel material 158, an insulative material 160 may be formed over the channel material 158 and within remaining portions of the openings 154 (FIG. 1J). The insulative material 160 may be separated from the insulative material 112 at least by the channel material 158.

The insulative material 160 may be formed of and include an insulative material, such as one or more of phosphosilicate glass (PSG), borosilicate glass (BSG), fluorosilicate glass (FSG), borophosphosilicate glass (BPSG), silicon dioxide, titanium dioxide, zirconium dioxide, hafnium dioxide, tantalum oxide, magnesium oxide, aluminum oxide, niobium oxide, molybdenum oxide, strontium oxide, barium oxide, yttrium oxide, a nitride material, (e.g., silicon nitride ($Si_3N_4$)), an oxynitride (e.g., silicon oxynitride), a dielectric carbon nitride material (e.g., silicon carbon nitride (SiCN)), and a dielectric carboxynitride material (e.g., silicon carboxynitride (SiOCN)). In some embodiments, the insulative material 160 comprises the same material composition as the insulative material 112. In some embodiments, the insulative material 160 comprises silicon dioxide.

The conductive barrier material 156, the channel material 158, and the insulative material 160 over the strings 132 of memory cells 134 may form pillars 162 comprising the strings 132, the conductive barrier material 156, the channel material 158, and the insulative material 160.

Figure 1L:
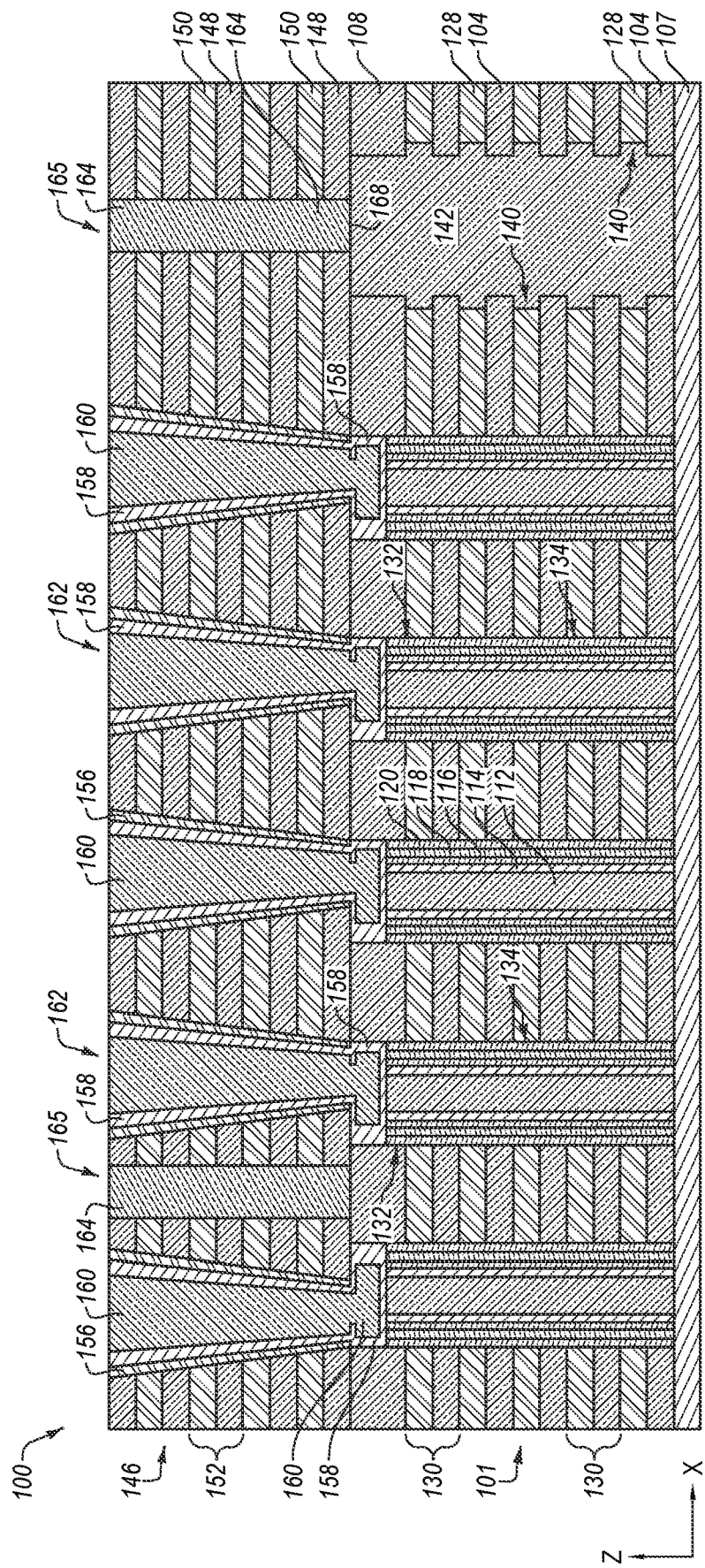

FIG. 1M is a top view of the microelectronic device structure 100 of FIG. 1L. FIG. 1L is a cross-sectional view of the microelectronic device structure 100 taken through section line L-L of FIG. 1M. Referring now to FIG. 1L and FIG. 1M, after forming the pillars 162, slots 165 may be formed between some of the pillars 162 to separate the microelectronic device structure 100 into sub-block structures 166. The dielectric material 142 of the slot 124 is illustrated in broken lines in FIG. 1M to illustrate that the dielectric material 142 and the slot 124 are located under an upper surface of the microelectronic device structure 100. In some embodiments, one of the slots 165 overlies a slot 124.

The slots 165 may comprise a dielectric material 164, such as one or more of the materials described above with reference to the dielectric material 142. In some embodiments, the dielectric material 164 comprises the same material composition as the dielectric material 142. In some embodiments, the dielectric material 164 comprises silicon dioxide.

With reference to FIG. 1L, a width (e.g., in the Y-direction) of the slots 165 is less than a width of the slots 124. For example, with reference to FIG. 1M, an interface 168 between the slots 165 and the slot 124 may be defined by a greater width of the slot 124 within the stack structure 101 than the width of the slot 165 within the another stack structure 146. Stated another way, in some embodiments, a width of the slot 124 may decrease to a width of the slot 165 at the interface between the stack structure 101 and the another stack structure 146.

Figure 1N:
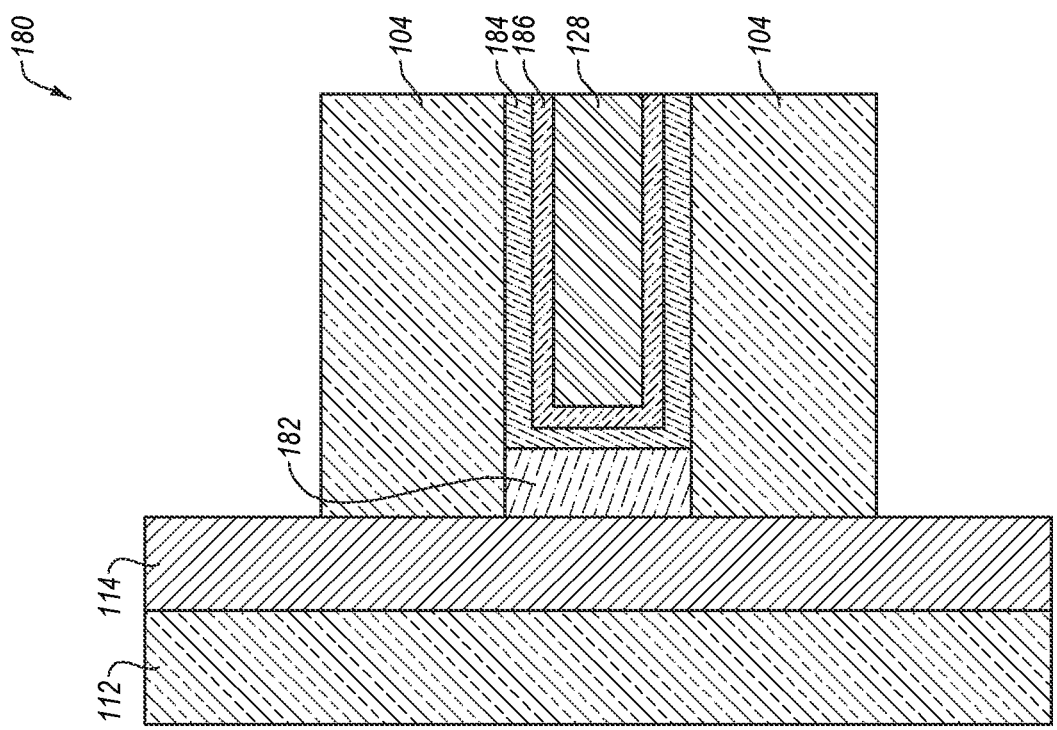
FIG. 1N is a simplified cross-sectional view of a memory cell, in accordance with embodiments of the disclosure.

Although the memory cells 134 have been described and illustrated as comprising a particular structure, the disclosure is not so limited. In other embodiments, the memory cells 134 of the strings 132 may be different than those described. FIG. 1N is a simplified cross-sectional view of a memory cell 180 that may replace one or more of the memory cells 134 of the strings 132, in accordance with embodiments of the disclosure. The memory cell 180 may include the insulative material 112 and the channel material 114 as described above with reference to the memory cells 134. The memory cell 180 may further include a first dielectric material (e.g., a tunnel dielectric material) 182 horizontally adjacent to the channel material 114, a second dielectric material (e.g., a charge trapping material) 184 horizontally adjacent to the first dielectric material 182, and a third dielectric material (e.g., a charge blocking material) 186 horizontally adjacent to the second dielectric material 184 and the conductive structure 128. In some embodiments, the first dielectric material 182 comprises an oxide material (e.g., silicon dioxide), the second dielectric material 184 comprises a nitride material (e.g., silicon nitride), and the third dielectric material 186 comprises an oxide material (e.g., silicon dioxide).

As described above, forming the another stack structure 146 to include the conductive structures 150 formed by PVD may facilitate improved performance of the microelectronic device structure 100. For example, the conductive structures 150 formed by PVD may exhibit a decreased resistivity (and a corresponding increased conductivity) compared to conductive structures formed by other methods, such as ALD. The reduced resistivity of the conductive structures 150 may improve performance of the strings 132 of memory cells 134. In addition, since the conductive structures 150 are formed directly by PVD rather than by replacement of a sacrificial structure (e.g., silicon nitride) to form a conductive structure, as in conventional microelectronic devices, the conductive structures 150 may not include halides, such as fluorine, which may be present in conductive structures formed with halide-containing precursors.

Since the another stack structure 146 is formed after forming the conductive structures 128 and the associated strings 132 of memory cells 134, the conductive structures 150 of the another stack structure 146 may not include materials such as the dielectric barrier material 136 or the conductive liner material 138. Since the conductive structures 150 do not include the dielectric barrier material 136 or the conductive liner material 138, the conductive structures 150 may be formed to have a greater thickness (e.g., in the Z-direction) compared to conventional microelectronic device structures. The conductive structures 150 having a greater thickness may exhibit a greater electrical conductivity than conductive structures of conventional microelectronic device structures.

In addition, conventional microelectronic device structures may be formed by forming the select gate structures, such as select gate drain structures (e.g., corresponding to the conductive structures 150) simultaneously with formation of the strings of memory cells. However, forming the select gate structures simultaneously with the strings of memory cells may increase a height of the stack structure from which the strings and select gate structures are formed. The increased height of the stack structure may increase a difficulty of formation of the strings of memory cells during formation of the microelectronic device. By way of comparison, since the stack structure 101 according to embodiments of the disclosure does not include the conductive structures 150 when the strings 132 are formed, openings may be formed with greater uniformity and alignment compared to conventional microelectronic device structures wherein the openings are formed through additional tiers of insulative structures and other insulative structures.

Microelectronic device structures formed according to embodiments described herein may exhibit improved alignment between contact structures forming electrical contacts to the strings 132 (e.g., such as through the pillars 162) compared to conventional microelectronic device structures. By way of comparison, fabrication of conventional microelectronic device structures may include fabrication of the select gate structures (e.g., the conductive structures 150 comprising select gate drain structures) simultaneously with formation of word lines (e.g., conductive structures 128) through the replacement gate process. However, the replacement gate process may cause stresses in the stack structure (e.g., the stack structure 101), leading to block bending. The block bending may lead to misalignment between contacts to be formed in electrical communication with the strings. Since the conductive structures 150 are formed after the replacement gate process, the contacts to the strings 132 and the pillars 162 may be aligned.

Figure 2:
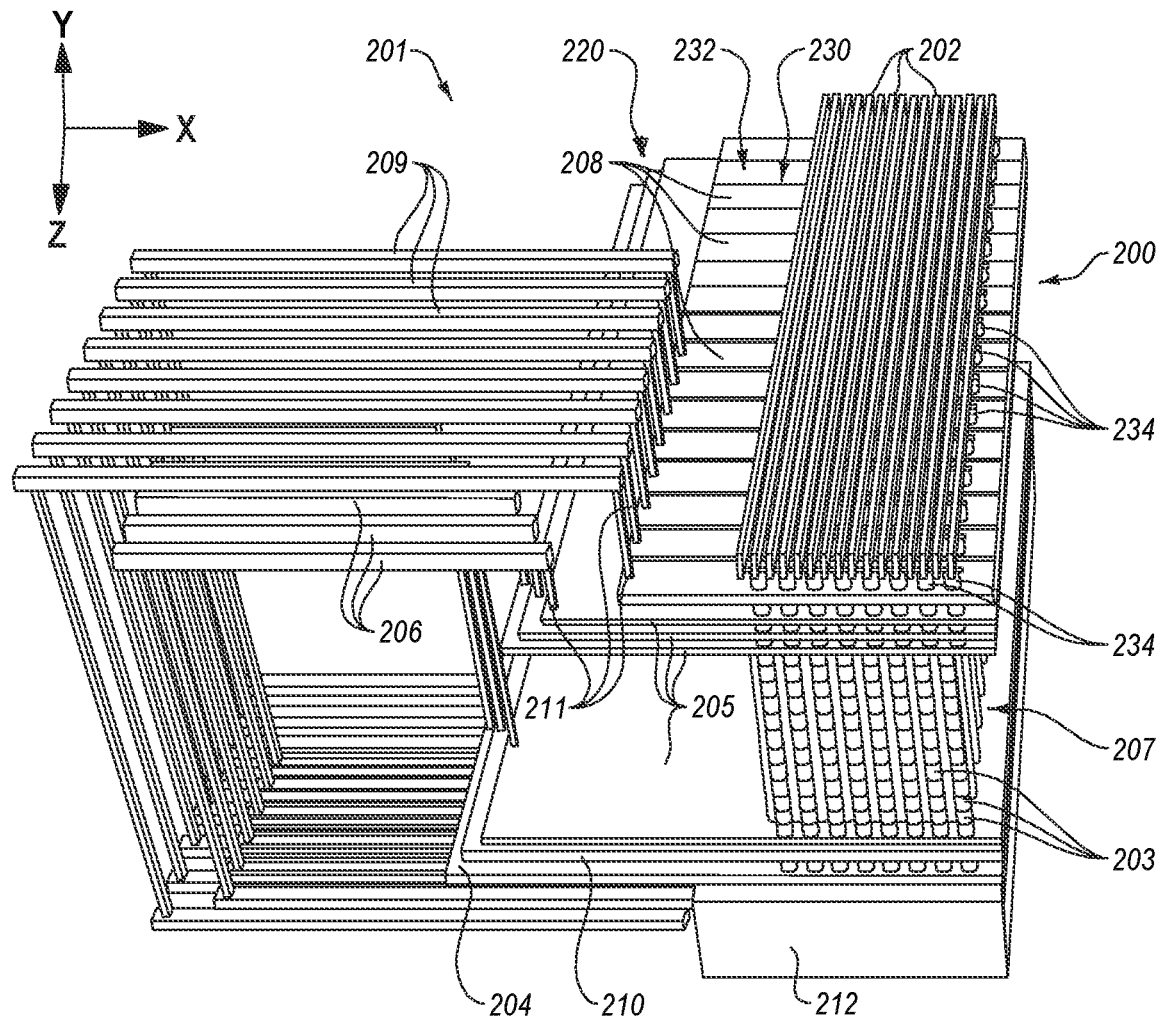
FIG. 2 is a partial cutaway perspective view of a microelectronic device, in accordance with embodiments of the disclosure.

FIG. 2 illustrates a partial cutaway perspective view of a portion of a microelectronic device 201 (e.g., a memory device, such as a dual deck 3D NAND Flash memory device) including a microelectronic device structure 200. The microelectronic device structure 200 may be substantially similar to the microelectronic device structure 100 previously described with reference to FIG. 1A through FIG.

1N. As shown in FIG. 2, the microelectronic device structure 200 may include a staircase structure 220 defining contact regions for connecting access lines 206 to conductive tiers 205 (e.g., conductive layers, conductive plates, such as the conductive structures 128 (FIG. 1L)). The microelectronic device structure 200 may include vertical strings 207 (e.g., strings 132 (FIG. 1L)) of memory cells 203 (e.g., memory cells 134 (FIG. 1L), memory cells 180 (FIG. 1N)) that are coupled to each other in series. The vertical strings 207 may extend vertically (e.g., in the Z-direction) and orthogonally to conductive lines and conductive tiers 205, such as data lines 202, a source tier 204 (e.g., the source structure 107 (FIG. 1L)), the conductive tiers 205, the access lines 206, first select gates 208 (e.g., upper select gates, drain select gates (SGDs), such as the conductive structures 150 (FIG. 1L)), select lines 209, and a second select gate 210 (e.g., a lower select gate, a source select gate (SGS)). The select gates 208 may be horizontally divided (e.g., in the Y-direction) into multiple blocks 232 (e.g., blocks 126 (FIG. 1M)) horizontally separated (e.g., in the Y-direction) from one another by slots 230 (e.g., the dielectric material 142 (FIG. 1L, FIG. 1M) formed within the replacement gate slot 124 (FIG. 1M)).

Vertical conductive contacts 211 may electrically couple components to each other as shown. For example, the select lines 209 may be electrically coupled to the first select gates 208 and the access lines 206 may be electrically coupled to the conductive tiers 205. The microelectronic device 201 may also include a control unit 212 positioned under the memory array, which may include at least one of string driver circuitry, pass gates, circuitry for selecting gates, circuitry for selecting conductive lines (e.g., the data lines 202, the access lines 206), circuitry for amplifying signals, and circuitry for sensing signals. The control unit 212 may be electrically coupled to the data lines 202, the source tier 204, the access lines 206, the first select gates 208, and the second select gates 210, for example. In some embodiments, the control unit 212 includes CMOS (complementary metal-oxide-semiconductor) circuitry. In such embodiments, the control unit 212 may be characterized as having a "CMOS under Array" ("CuA") configuration.

The first select gates 208 may extend horizontally in a first direction (e.g., the X-direction) and may be coupled to respective first groups of vertical strings 207 of memory cells 203 at a first end (e.g., an upper end) of the vertical strings 207. The second select gate 210 may be formed in a substantially planar configuration and may be coupled to the vertical strings 207 at a second, opposite end (e.g., a lower end) of the vertical strings 207 of memory cells 203.

The data lines 202 (e.g., bit lines) may extend horizontally in a second direction (e.g., in the Y-direction) that is at an angle (e.g., perpendicular) to the first direction in which the first select gates 208 extend. The data lines 202 may be coupled to respective second groups of the vertical strings 207 at the first end (e.g., the upper end) of the vertical strings 207. A first group of vertical strings 207 coupled to a respective first select gate 208 may share a particular vertical string 207 with a second group of vertical strings 207 coupled to a respective data line 202. Thus, a particular vertical string 207 may be selected at an intersection of a particular first select gate 208 and a particular data line 202. Accordingly, the first select gates 208 may be used for selecting memory cells 203 of the vertical strings 207 of memory cells 203.

The conductive tiers 205 (e.g., word line plates) may extend in respective horizontal planes. The conductive tiers 205 may be stacked vertically, such that each conductive tier 205 is coupled to all of the vertical strings 207 of memory cells 203, and the vertical strings 207 of the memory cells 203 extend vertically through the stack of conductive tiers 205. The conductive tiers 205 may be coupled to or may form control gates of the memory cells 203 to which the conductive tiers 205 are coupled. Each conductive tier 205 may be coupled to one memory cell 203 of a particular vertical string 207 of memory cells 203.

The first select gates 208 and the second select gates 210 may operate to select a particular vertical string 207 of the memory cells 203 between a particular data line 202 and the source tier 204. Thus, a particular memory cell 203 may be selected and electrically coupled to a data line 202 by operation of (e.g., by selecting) the appropriate first select gate 208, second select gate 210, and conductive tier 205 that are coupled to the particular memory cell 203.

The staircase structure 220 may be configured to provide electrical connection between the access lines 206 and the conductive tiers 205 through the vertical conductive contacts 211. In other words, a particular level of the conductive tiers 205 may be selected via an access line 206 in electrical communication with a respective vertical conductive contact 211 in electrical communication with the particular conductive tier 205.

The data lines 202 may be electrically coupled to the vertical strings 207 through conductive contact structures 234 (e.g., contact structures formed over the pillars 162 (FIG. 1L)).

Thus, in accordance with some embodiments of the disclosure, a microelectronic device comprises a stack structure comprising alternating conductive structures and insulative structures arranged in tiers, each of the tiers individually comprising a conductive structure and an insulative structure, strings of memory cells vertically extending through the stack structure, the strings of memory cells comprising a channel material vertically extending through the stack structure, and another stack structure vertically overlying the stack structure and comprising other tiers of alternating levels of other conductive structures and other insulative structures, the other conductive structures exhibiting a conductivity greater than a conductivity of the conductive structures of the stack structure.

Furthermore, in accordance with additional embodiments of the disclosure, a memory device comprises a stack structure comprising tiers of alternating conductive structures and insulative structures, another stack structure vertically overlying the stack structure and comprising other conductive structures and other insulative structures arranged in other tiers, each of the other tiers comprising one of the other conductive structures and one of the other insulative structures, the other conductive structures exhibiting a larger grain size than the conductive structures, and pillars extending through the stack structure and the other stack structure. Each pillar comprises a channel material extending through the stack structure and the other stack structure, and a string of memory cells comprising the channel material and at least one dielectric material within the stack structure. The method device further comprises select gate slots extending through the other stack structure.

Moreover, in accordance with further embodiments of the disclosure, a method of forming a microelectronic device comprises forming a first stack structure comprising alternating conductive structures and insulative structures. Forming the first stack structure comprises forming memory strings comprising a channel material and at least one dielectric material extending through the first stack structure, and forming a second stack structure comprising alternating other conductive structures and other insulative structures vertically over the first stack structure. Forming the second stack structure comprises forming the other conductive structures by physical vapor deposition, forming openings in the second stack structure vertically overlying the memory strings, and forming a channel material in electrical communication with the channel material of the memory strings.

Figure 3:
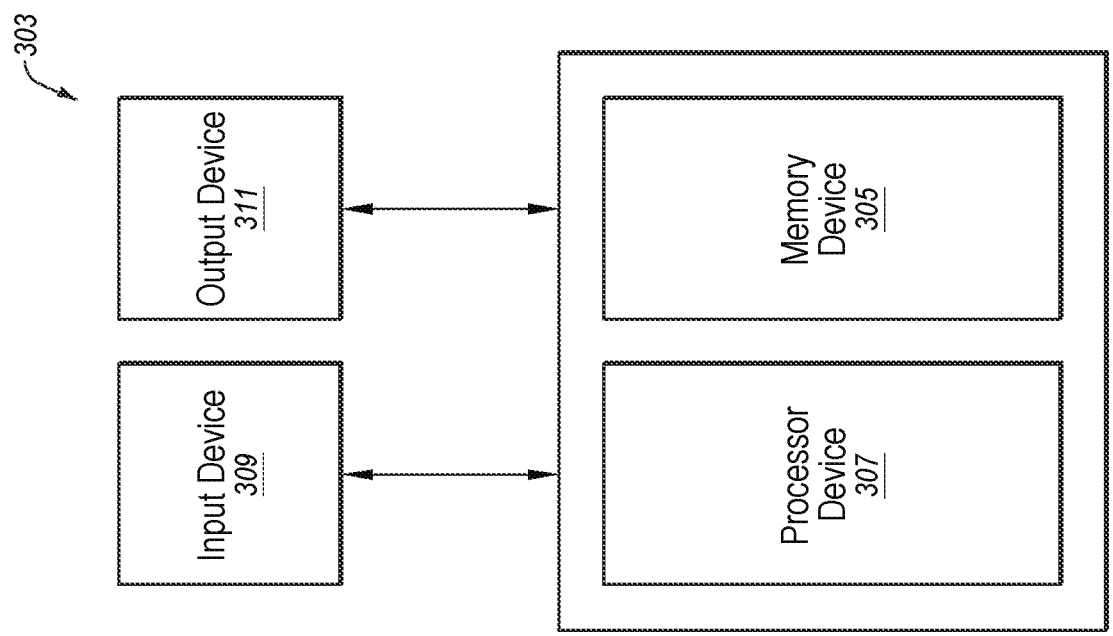
FIG. 3 is a block diagram of an electronic system, in accordance with embodiments of the disclosure.

Microelectronic devices including microelectronic devices (e.g., the microelectronic device 201) and microelectronic device structures (e.g., the microelectronic device structure 100, 200) including conductive structures 150 exhibiting a relatively greater electrical conductivity than other conductive structures 128, according embodiments of the disclosure may be used in embodiments of electronic systems of the disclosure. For example, FIG. 3 is a block diagram of an electronic system 303, in accordance with embodiments of the disclosure. The electronic system 303 may comprise, for example, a computer or computer hardware component, a server or other networking hardware component, a cellular telephone, a digital camera, a personal digital assistant (PDA), portable media (e.g., music) player, a Wi-Fi or cellular-enabled tablet such as, for example, an iPAD® or SURFACE® tablet, an electronic book, a navigation device, etc. The electronic system 303 includes at least one memory device 305. The memory device 305 may include, for example, an embodiment of a microelectronic device structure previously described herein (e.g., the microelectronic device structure 100, 200) or a microelectronic device (e.g., the microelectronic device 201) previously described with reference to FIG. 1A through FIG. 1N and FIG. 2, including the including the conductive structures 150.

The electronic system 303 may further include at least one electronic signal processor device 307 (often referred to as a "microprocessor"). The electronic signal processor device 307 may, optionally, include an embodiment of a microelectronic device or a microelectronic device structure previously described herein (e.g., one or more of the microelectronic device 201 or the microelectronic device structure 100, 200 previously described with reference to FIG. 1A through FIG. 1N and FIG. 2). The electronic system 303 may further include one or more input devices 309 for inputting information into the electronic system 303 by a user, such as, for example, a mouse or other pointing device, a keyboard, a touchpad, a button, or a control panel. The electronic system 303 may further include one or more output devices 311 for outputting information (e.g., visual or audio output) to a user such as, for example, a monitor, a display, a printer, an audio output jack, a speaker, etc. In some embodiments, the input device 309 and the output device 311 may comprise a single touchscreen device that can be used both to input information to the electronic system 303 and to output visual information to a user. The input device 309 and the output device 311 may communicate electrically with one or more of the memory device 305 and the electronic signal processor device 307.

Figure 4:
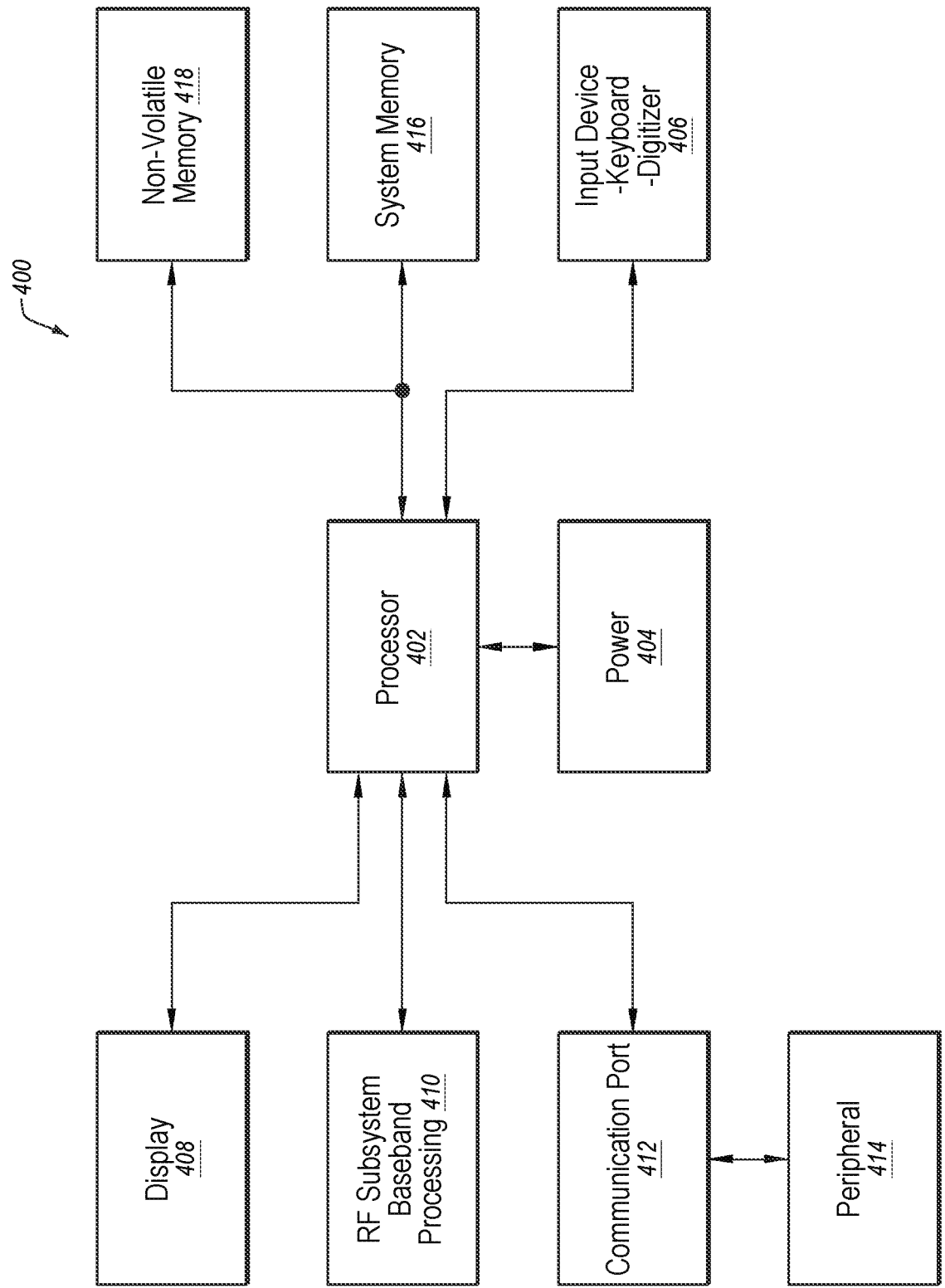
FIG. 4 is a block diagram of a processor-based system, in accordance with embodiments of the disclosure.

With reference to FIG. 4, depicted is a processor-based system 400. The processor-based system 400 may include various microelectronic devices and microelectronic device structures (e.g., microelectronic devices and microelectronic device structures including one or more of the microelectronic device 201 or the microelectronic device structure 100, 200) manufactured in accordance with embodiments of the present disclosure. The processor-based system 400 may be any of a variety of types such as a computer, pager, cellular phone, personal organizer, control circuit, or other electronic device. The processor-based system 400 may include one or more processors 402, such as a microprocessor, to control the processing of system functions and requests in the processor-based system 400. The processor 402 and other subcomponents of the processor-based system 400 may include microelectronic devices and microelectronic device structures (e.g., microelectronic devices and microelectronic device structures including one or more of the microelectronic device 201 or the microelectronic device structure 100, 200) manufactured in accordance with embodiments of the present disclosure.

The processor-based system 400 may include a power supply 404 in operable communication with the processor 402. For example, if the processor-based system 400 is a portable system, the power supply 404 may include one or more of a fuel cell, a power scavenging device, permanent batteries, replaceable batteries, and rechargeable batteries. The power supply 404 may also include an AC adapter; therefore, the processor-based system 400 may be plugged into a wall outlet, for example. The power supply 404 may also include a DC adapter such that the processor-based system 400 may be plugged into a vehicle cigarette lighter or a vehicle power port, for example.

Various other devices may be coupled to the processor 402 depending on the functions that the processor-based system 400 performs. For example, a user interface 406 may be coupled to the processor 402. The user interface 406 may include input devices such as buttons, switches, a keyboard, a light pen, a mouse, a digitizer and stylus, a touch screen, a voice recognition system, a microphone, or a combination thereof. A display 408 may also be coupled to the processor 402. The display 408 may include an LCD display, an SED display, a CRT display, a DLP display, a plasma display, an OLED display, an LED display, a three-dimensional projection, an audio display, or a combination thereof. Furthermore, an RF sub-system/baseband processor 410 may also be coupled to the processor 402. The RF sub-system/baseband processor 410 may include an antenna that is coupled to an RF receiver and to an RF transmitter (not shown). A communication port 412, or more than one communication port 412, may also be coupled to the processor 402. The communication port 412 may be adapted to be coupled to one or more peripheral devices 414, such as a modem, a printer, a computer, a scanner, or a camera, or to a network, such as a local area network, remote area network, intranet, or the Internet, for example.

The processor 402 may control the processor-based system 400 by implementing software programs stored in the memory. The software programs may include an operating system, database software, drafting software, word processing software, media editing software, or media playing software, for example. The memory is operably coupled to the processor 402 to store and facilitate execution of various programs. For example, the processor 402 may be coupled to system memory 416, which may include one or more of spin torque transfer magnetic random access memory (STT-MRAM), magnetic random access memory (MRAM), dynamic random access memory (DRAM), static random access memory (SRAM), racetrack memory, and other known memory types. The system memory 416 may include volatile memory, non-volatile memory, or a combination thereof. The system memory 416 is typically large so that it can store dynamically loaded applications and data. In some embodiments, the system memory 416 may include semiconductor devices, such as the microelectronic devices and microelectronic device structures (e.g., the microelectronic device 201 and the microelectronic device structure 100, 200) described above, or a combination thereof.

The processor 402 may also be coupled to non-volatile memory 418, which is not to suggest that system memory 416 is necessarily volatile. The non-volatile memory 418 may include one or more of STT-MRAM, MRAM, read-only memory (ROM) such as an EPROM, resistive read-only memory (RROM), and flash memory to be used in conjunction with the system memory 416. The size of the non-volatile memory 418 is typically selected to be just large enough to store any necessary operating system, application programs, and fixed data. Additionally, the non-volatile memory 418 may include a high-capacity memory such as disk drive memory, such as a hybrid-drive including resistive memory or other types of non-volatile solid-state memory, for example. The non-volatile memory 418 may include microelectronic devices, such as the microelectronic devices and microelectronic device structures (e.g., the microelectronic device 201 and the microelectronic device structure 100, 200) described above, or a combination thereof.

Accordingly, in at least some embodiments, an electronic device comprises an input device, an output device, a processor device operably coupled to the input device and the output device, and a memory device operably coupled to the processor device and comprising at least one microelectronic device. The at least one microelectronic device comprises strings of memory cells extending through a first stack structure comprising alternating levels of insulative structures and conductive structures, a second stack structure vertically overlying the first stack structure and comprising alternating levels of other insulative structures and other conductive structures, the other conductive structures exhibiting a greater conductivity than the conductive structures of the first stack structure, and a channel material extending through the second stack structure and in electrical communication with a channel material of the strings of memory cells.

Example

Figure 5:
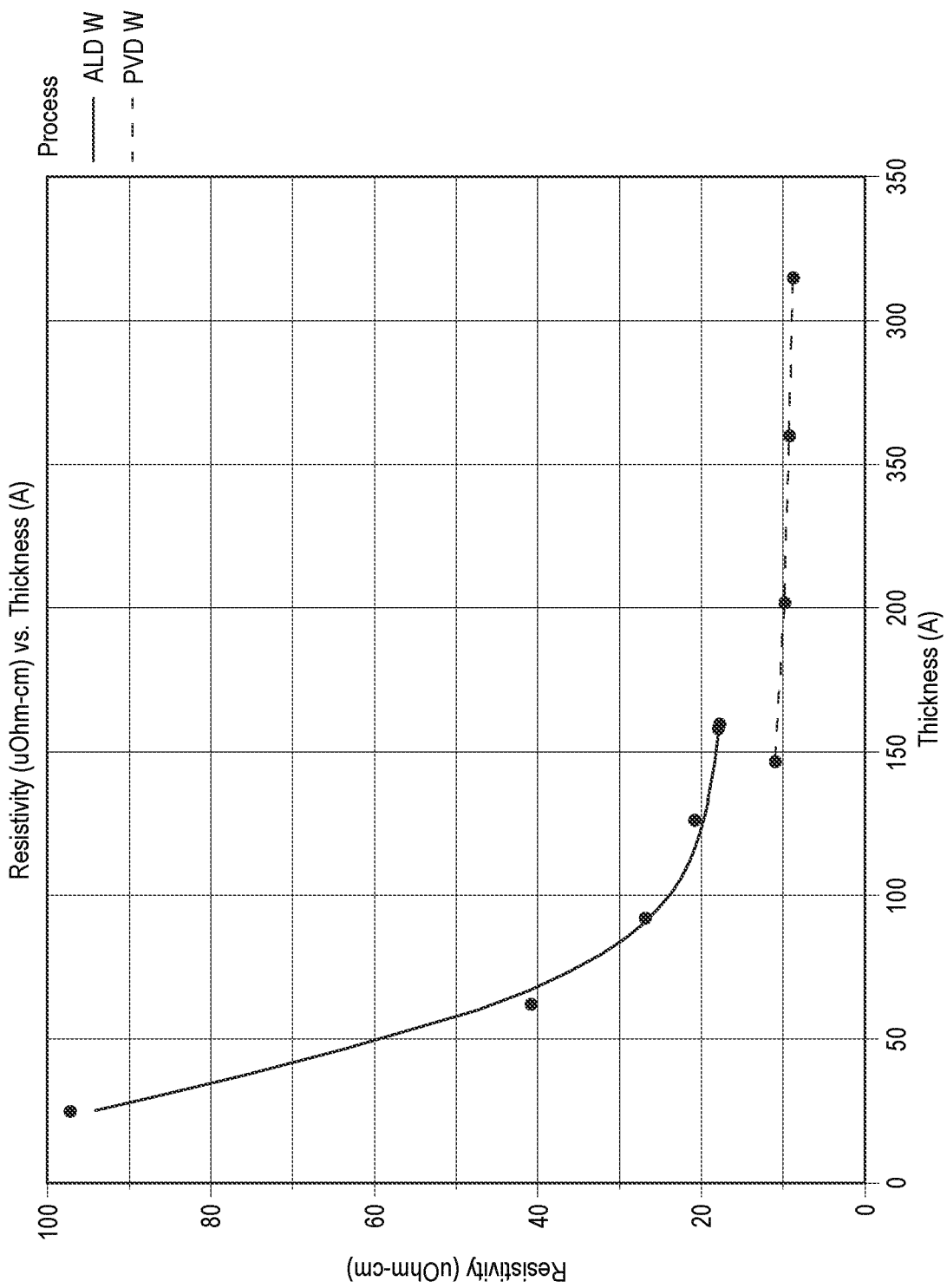
FIG. 5 is a graph comparing the resistivity of tungsten formed by atomic layer deposition to the resistivity of tungsten formed by physical vapor deposition.

Tungsten was formed by PVD (referred to as "PVD tungsten") and the electrical resistivity thereof was compared with tungsten formed by ALD (referred to as "ALD tungsten"). The PVD tungsten was formed by sputtering a target comprising tungsten with an argon plasma. The ALD tungsten was formed with hexafluoride and silane precursors. FIG. 5 is a graph illustrating the resistivity of the ALD tungsten and the resistivity of the PVD tungsten as a function of a thickness of the respective ALD tungsten and the PVD tungsten. As can be seen in FIG. 5, the PVD tungsten exhibited a lower resistivity than the ALD tungsten. For example, at a thickness of about 150 Å, the resistivity of the PVD tungsten was about 11 $\mu\Omega$/cm while the resistivity of the ALD tungsten was about 18 $\mu\Omega$/cm.

While certain illustrative embodiments have been described in connection with the figures, those of ordinary skill in the art will recognize and appreciate that embodiments encompassed by the disclosure are not limited to those embodiments explicitly shown and described herein. Rather, many additions, deletions, and modifications to the embodiments described herein may be made without departing from the scope of embodiments encompassed by the disclosure, such as those hereinafter claimed, including legal equivalents. In addition, features from one disclosed embodiment may be combined with features of another disclosed embodiment while still being encompassed within the scope of the disclosure.

What is claimed is:

1. A microelectronic device, comprising:
a first stack structure comprising first tiers each comprising a level of a first conductive material and a level of a first insulative material vertically neighboring the level of the first conductive material;
a second stack structure vertically overlying the first stack structure and comprising second tiers each comprising a level of a second conductive material and a level of a second insulative material, the second conductive material exhibiting a larger average grain size than the first conductive material; and
strings of memory cells each individually comprising a channel material and a memory material vertically extending through the first stack structure, the memory material terminating in a dielectric material between the first stack structure and the second stack structure.

2. The microelectronic device of claim 1, wherein a quantity of the second tiers is fewer than a quantity of the first tiers.

3. The microelectronic device of claim 1, wherein each level of the second conductive material of the second tiers individually comprises a select gate structure.

4. The microelectronic device of claim 1, wherein the second conductive material directly contacts the second insulative material.

5. The microelectronic device of claim 1, further comprising a conductive liner material interposed between the first conductive material and the first insulative material.

6. The microelectronic device of claim 1, wherein:
the first conductive material comprises chemical vapor deposition (CVD)-formed tungsten; and
the second conductive material comprises physical vapor deposition (PVD)-formed tungsten exhibiting different properties than the first conductive material.

7. The microelectronic device of claim 1, wherein the second conductive material is substantially free of moisture and halogens.

8. The microelectronic device of claim 1, wherein a thickness of the second conductive material is greater than a thickness of the first conductive material.

9. A microelectronic device, comprising:
a first stack structure comprising first tiers each comprising alternating conductive structures and insulative structures;
a replacement gate structure vertically extending through the first stack structure and comprising a dielectric material;
a second stack structure vertically overlying the first stack structure and the replacement gate structure and comprising second tiers each comprising additional conductive structures and additional insulative structures; and
a select gate slot vertically extending through second stack structure and comprising an additional dielectric material, the select gate slot comprising curved surfaces.

10. The microelectronic device of claim 9, further comprising a conductive barrier material between a channel material extending through the second stack structure and the second tiers.

11. The microelectronic device of claim 10, wherein the conductive barrier material comprises titanium nitride.

12. The microelectronic device of claim 9, wherein a distance between the select gate slot and a neighboring select gate slot is less than a distance between the replacement gate structure and a neighboring select gate structure.

13. The microelectronic device of claim 9, wherein a material composition of the conductive structures is different than a material composition of the additional conductive structures.

14. The microelectronic device of claim 9, further comprising a channel material vertically extending through the second stack structure and the first stack structure, a width of the channel material greater in second stack structure than in the first stack structure.

15. A microelectronic device, comprising:
- a first stack structure comprising vertically alternating first conductive structures and first insulative structures;
- a second stack structure vertically overlying the first stack structure and comprising vertically alternating second conductive structures and second insulative structures, the second conductive structures having greater electrical conductivity and fewer impurities than the first conductive structures;
- strings of memory cells vertically extending through the first stack structure and in electrical communication with the first conductive structures;
- pillars vertically extending through the second stack structure and vertically overlying the strings of memory cells, the pillars each individually comprising a conductive barrier material and a channel material horizontally intervening between the second conductive structures and an insulative material; and
- a replacement gate structure vertically extending through the first stack structure and comprising a dielectric material.

16. The microelectronic device of claim 15, further comprising a select gate slot vertically extending through the second stack structure.

17. The microelectronic device of claim 16, wherein the select gate slot is closer to at least one string of memory cells of the strings of memory cells than other strings of memory cells of the strings of memory cells.

18. The microelectronic device of claim 16, wherein the select gate slot is located within horizontal boundaries of the replacement gate structure.

19. The microelectronic device of claim 16, wherein vertical sidewalls of the replacement gate structure are not parallel with vertical sidewalls of the select gate slot.

20. The microelectronic device of claim 15, further comprising at least one of a dielectric barrier material and a conductive liner material between each of the first conductive structures and the first insulative structures.

* * * * *

UNITED STATES PATENT AND TRADEMARK OFFICE
CERTIFICATE OF CORRECTION

PATENT NO. : 12,171,101 B2
APPLICATION NO. : 17/822708
DATED : December 17, 2024
INVENTOR(S) : Daniel Billingsley et al.

Page 1 of 1

It is certified that error appears in the above-identified patent and that said Letters Patent is hereby corrected as shown below:

In the Specification

| | | |
|---|---|---|
| Column 4, | Line 43, | change "iridium (Jr), nickel" to --iridium (Ir), nickel-- |
| Column 4, | Lines 66-67, | change "magnesium oxide $(MgO)_x$), at least" to --magnesium oxide $(MgO_x)$), at least-- |
| Column 10, | Lines 1-2, | change "ruthenium oxide $(RUO_x)$, alloys thereof," to --ruthenium oxide $(RuO_x)$, alloys thereof,-- |
| Column 12, | Line 22, | change "--ruthenium oxide $(RUO_x)$, alloys" to --ruthenium oxide $(RuO_x)$, alloys-- |

Signed and Sealed this
Twenty-fifth Day of February, 2025

Coke Morgan Stewart
*Acting Director of the United States Patent and Trademark Office*